United States Patent
Lee et al.

(10) Patent No.: US 9,831,877 B2
(45) Date of Patent: Nov. 28, 2017

(54) INTEGRATED CIRCUIT AND SEMICONDUCTOR DEVICE INCLUDING THE SAME

(71) Applicant: SAMSUNG ELECTRONICS CO., LTD., Suwon-si, Gyeonggi-do (KR)

(72) Inventors: Dal-Hee Lee, Seoul (KR); Jae-Woo Seo, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/211,468

(22) Filed: Jul. 15, 2016

(65) Prior Publication Data

US 2017/0093401 A1     Mar. 30, 2017

(30) Foreign Application Priority Data

Sep. 24, 2015 (KR) .................. 10-2015-0135554

(51) Int. Cl.
*H03K 19/0185* (2006.01)
*H01L 27/092* (2006.01)
*H03K 19/00* (2006.01)

(52) U.S. Cl.
CPC . *H03K 19/018521* (2013.01); *H01L 27/0928* (2013.01); *H03K 19/0013* (2013.01)

(58) Field of Classification Search
CPC ........ H03K 19/018521; H03K 19/0013; H01L 27/0928

USPC .............................. 326/81, 101, 80; 257/206
See application file for complete search history.

(56) References Cited

U.S. PATENT DOCUMENTS

| | | | |
|---|---|---|---|
| 5,745,374 A | 4/1998 | Matsumoto | |
| 6,710,371 B2 | 3/2004 | Kitahara et al. | |
| 6,820,246 B2 | 11/2004 | Hino et al. | |
| 6,903,389 B1 | 6/2005 | Tai et al. | |
| 7,095,063 B2 | 8/2006 | Cohn et al. | |
| 7,495,296 B2 | 2/2009 | Maeda et al. | |
| 7,737,756 B2 | 6/2010 | Usami | |
| 8,487,658 B2 | 7/2013 | Datta et al. | |
| 8,635,572 B1 | 1/2014 | Jin et al. | |
| 2013/0015882 A1* | 1/2013 | Datta ............... | H03K 19/01852 326/80 |
| 2015/0109045 A1 | 4/2015 | Vilangudipitchai et al. | |
| 2015/0244366 A1* | 8/2015 | Lee .................... | H03K 19/0013 326/80 |

* cited by examiner

*Primary Examiner* — Daniel D Chang
(74) *Attorney, Agent, or Firm* — F. Chau & Associates, LLC

(57) ABSTRACT

An integrated circuit (IC) includes a first circuit, a first well and a second circuit. The first circuit is disposed on a substrate and configured to shift a first bit signal between a first voltage logic level and a second logic voltage level. The first well is disposed in a cell on the substrate and biased to a first voltage. The first well is spaced apart from a first edge of the cell. The second well is disposed in the cell and biased to a second voltage. The second well is disposed to contact a second edge of the cell opposite to the first edge. The first circuit includes a plurality of transistors respectively disposed in the first and second wells.

19 Claims, 16 Drawing Sheets

INTEGRATED CIRCUIT AND SEMICONDUCTOR DEVICE INCLUDING THE SAME

CROSS-REFERENCE TO RELATED APPLICATION

This application claims priority under 35 U.S.C. §119(a) to Korean Patent Application No. 10-2015-0135554, filed on Sep. 24, 2015, in the Korean Intellectual Property Office, the disclosure of which is incorporated by reference in its entirety herein.

BACKGROUND

1. Technical Field

The inventive concept relates to an integrated circuit (IC) and a semiconductor device including the same, and more particularly, to an IC including a multi-voltage circuit.

2. Discussion of Related Art

Due to advances in semiconductor process technology, sizes of transistors have been progressively reduced, and thus, a greater number of transistors can be integrated into a single semiconductor device. A system-on chip (SoC) is an IC that integrates all elements of a computer or another electronic system into a single chip. An SoC may be used to execute various small applications. As the number and complexity of operations performed by the applications increases, a greater number of elements are needed within each semiconductor device. However, increasing the number of elements also increases the amount of power consumed by the device.

Elements included in each of the semiconductor devices may be driven with different supply voltages. Power consumption may be reduced by cutting off application of one of the supply voltages to an unused element within a corresponding one of the semiconductor devices.

SUMMARY

At least one embodiment of the inventive concept provides an IC, including a multi-voltage circuit having a reduced area and power consumption, and a semiconductor device including the same.

At least one embodiment of the inventive concept provides a method of generating a layout of an IC by using a multi-voltage circuit.

According to an exemplary embodiment of the inventive concept, there is provided an integrated circuit (IC) including at least one block which includes a first cell disposed on an edge of the at least one block. The first cell includes a first circuit, a first well, and a second well. The first circuit is configured to shift a first bit signal between a first voltage logic level and a second voltage logic level. The first well is biased to a first voltage. The first well is spaced apart from a first edge of the first cell. The second well is biased to a second voltage. The second well is disposed to contact a second edge of the first cell opposite to the first edge. The first edge of the first cell contacts the edge of the at least one block. The first circuit includes a plurality of transistors respectively disposed in the first and second wells.

According to an exemplary embodiment of the inventive concept, there is provided an integrated circuit (IC) including first and second blocks disposed adjacent to each other. The first block may include at least one unit cell contacting a boundary between the first and second blocks. The at least one unit cell may include a first bit circuit configured to shift a first bit signal between a first voltage logic level and a second voltage logic level, a first well biased to a first voltage and disposed to be spaced apart from a boundary of the at least one unit cell, and a second well biased to a second voltage and disposed to contact a second side of the at least one unit cell opposite to a first side of the at least one unit cell contacting the boundary. The first bit circuit may include a plurality of transistors respectively disposed in the first and second wells.

According to an exemplary embodiment of the inventive concept, there is provided an integrated circuit (IC) including a first circuit, a second circuit, and first through third wells. The first circuit is disposed on a substrate and configured to shift a first bit signal between a first voltage logic level and a second voltage logic level. The second circuit is disposed on the substrate and configured to shift a second bit signal between the first voltage logic level and the second voltage logic level. The first well is disposed in a cell on the substrate and biased to a first voltage. The first well is spaced apart from a first edge of the cell. The second and third wells are biased to a second voltage different from the first voltage. The second well contacts the first edge and the third well contacts a second edge of the cell. The first and second circuits each include at least one of a plurality of transistors disposed in the first well and at least one of a plurality of transistors disposed in the second well.

According to an exemplary embodiment of the inventive concept, there is provided an integrated circuit (IC) including at least one unit cell, wherein the at least one unit cell includes a first bit circuit configured to shift a first bit signal between a first voltage logic level and a second voltage logic level, a second bit circuit configured to shift a second bit signal between the second voltage logic level and a third voltage logic level, a first well biased to a first voltage and disposed to be spaced apart from a boundary of the at least one unit cell, second and third wells biased to a second voltage different from the first voltage, and a fourth well biased to a third voltage and disposed to be spaced apart from a boundary of the at least one unit cell between the first well and the third well. The second and third wells may respectively contact a pair of sides opposite to each other in a boundary of the at least one unit cell. The first bit circuit may include at least one of a plurality of transistors disposed in the first well and at least one of a plurality of transistors disposed in the second well. The second bit circuit may include at least one of a plurality of transistors disposed in the third well and at least one of a plurality of transistors disposed in the fourth well.

According to an exemplary embodiment of the inventive concept, there is provided an integrated circuit (IC) including a voltage level shifter disposed on a substrate and configured to shift a first signal between a first logic level and a second logic level, a first doped region disposed in a cell on the substrate and biased to a first voltage, and a second doped region disposed in the cell and biased to a second voltage. A first edge of the first doped region is spaced apart from a first edge of the cell by a first distance. A second opposing edge of the first doped region is spaced apart from a second opposing of edge of the cell by a second distance. The first distance is less than the second distance. The voltage level shifter includes a first transistor disposed in the first doped region and a second transistor disposed in the second doped region. The first transistor may be supplied with a current of a terminal providing the first voltage, and the second transistor may be supplied with a current of a terminal providing the second voltage. An edge of the second doped region may contact the second edge of the cell. The first and second cells may be spaced apart from one another. A width of the second cell may be smaller than a width of the first cell.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
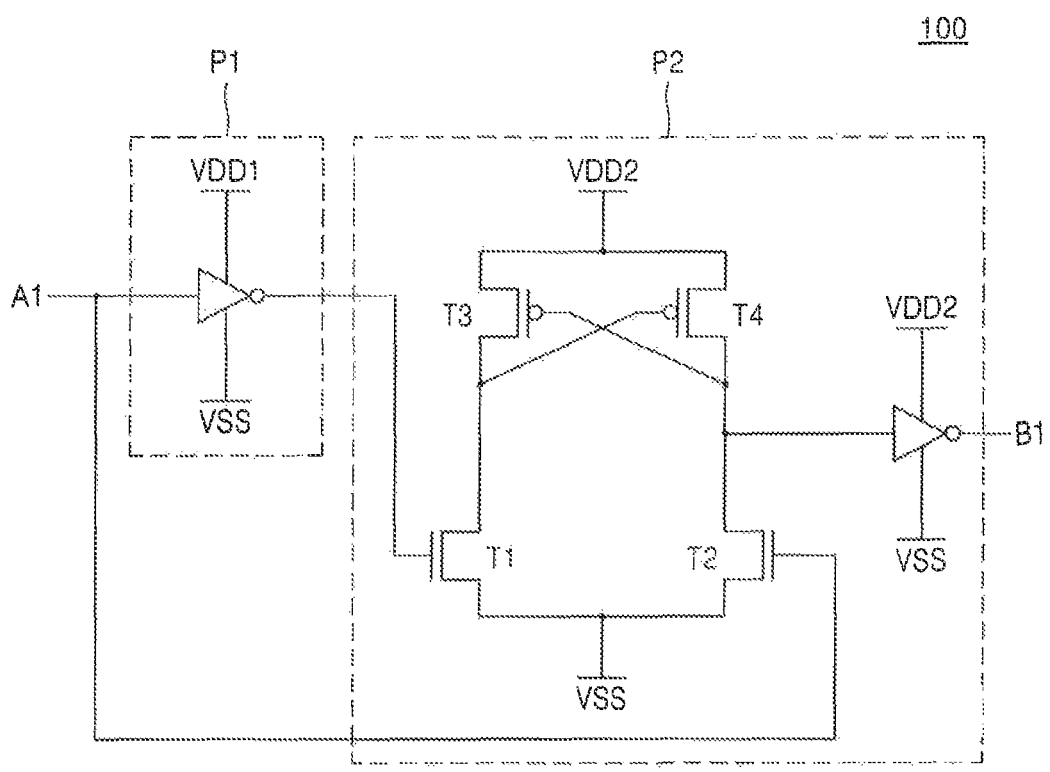
FIG. 1 is a diagram illustrating an example of a multi-voltage circuit according to an exemplary embodiment of the inventive concept.

Hereinafter, exemplary embodiments of the inventive concept will be described in detail with reference to the accompanying drawings. Embodiments of the inventive concept are provided so that this disclosure will be thorough and complete, and will fully convey the concept of the inventive concept to one of ordinary skill in the art. Since the inventive concept may have diverse embodiments, exemplary embodiments are illustrated in the drawings and are described in the detailed description of the inventive concept. However, the inventive concept is not limited to these specific embodiments and covers all modifications, equivalents, and replacements within the technical scope of the inventive concept. Like reference numerals refer to like elements throughout. The terms of a singular form may include plural forms unless the context clearly indicates otherwise. For example, the singular forms "a", "an" and "the" may include the plural forms as well.

FIG. 1 is a diagram illustrating an example of a multi-voltage circuit according to an exemplary embodiment of the inventive concept. The multi-voltage circuit is a circuit that is supplied with a plurality of different supply voltages, and will be described below as being a voltage level shifter 100. However, the inventive concept is not limited thereto. For example, the inventive concept may be applied to multi-voltage circuits different from the voltage level shifter 100 such as isolation cells and retention registers. Also, the circuit illustrated in FIG. 1 is merely an example of the voltage level shifter 100, and the voltage level shifter 100 may include a circuit different from the circuit of FIG. 1.

An IC included in a semiconductor device may process a digital signal, an analog signal, or a combination signal thereof. Examples of an IC for processing a digital signal may include a processor, a memory controller, a hardware encoder, a hardware decoder, and an interface block. The IC for processing a digital signal may process a digital signal based on a voltage of a digital signal line (e.g., based on a low-voltage state or a high-voltage state). A low voltage level and a high voltage level corresponding to a digital signal may be defined by a voltage level logic, and different voltage level logics may respectively define different low voltage levels and/or high voltage levels.

An IC for processing digital signals may be formed on a substrate to include a plurality of unit cells. One of the plurality of unit cells may correspond to a certain circuit that is included in the IC and may include a layout of the certain circuit. A semiconductor design tool may provide a standard cell according to a semiconductor process of manufacturing the IC, and the standard cell may have a certain height in order to improve disposition efficiency.

In an embodiment, the voltage level shifter 100 shifts a signal between first and second voltage logic levels which differ from one another. That is, the voltage level shifter 100 may convert a signal based on the first voltage logic level into a signal based on the second voltage logic level or may convert a signal based on the second voltage logic level into a signal based on the first voltage logic level. For example, the voltage level shifter 100 may convert a signal, having a low voltage level of 0 V and a high voltage level of 1.8 V, into a signal having a low voltage level of 0 V and a high voltage level of 3.3 V. The voltage level shifter 100 may be used to transfer a signal between semiconductor devices which are driven with different supply voltages, or may be used to transfer a signal, received from the outside of a semiconductor device, to the inside of the semiconductor device. Alternatively, the voltage level shifter 100 may be used to transfer a signal between blocks (e.g., circuits) driven with different supply voltages in a semiconductor device.

In order to perform such an operation, the voltage level shifter 100 may be supplied with supply voltages of circuits, which generate an input signal, and supply voltages of circuits to which an output signal is to be transferred. Referring to FIG. 1, the voltage level shifter 100 includes a first part P1, including inverter which is supplied with a current from a first voltage VDD1 terminal, and a second part P2 including transistors and inverter which are supplied with a current from a second voltage VDD2 terminal. In FIG. 1, the first voltage VDD1 may correspond to a high voltage level defined by a voltage logic level of a first input signal A1, and the second voltage VDD2 may correspond to a high voltage level defined by a voltage level logic of a first input signal B1. The inverter of the first part P1 may be implemented by at least one transistor and the inverter of the second part P2 may also be implemented by at least one transistor.

The second part P2 also includes a pair of non-complementary transistors T1 and T2, and a pair of complementary transistors T3 and T4. The output of the inverter of the first part P1 is provided to the gate terminal of the first non-complementary transistor T1. The gate of the second non-complementary transistor T2 receives the first input signal A1. A first non-gate terminal of the first complementary transistor T3 and a first non-gate terminal of the second complementary transistor T4 receive the second voltage VDD2. The second non-gate terminal of the first complementary transistor T3 is connected to a first non-gate terminal of the first non-complementary transistor T1 and to the gate terminal of the second complementary transistor T4. The second non-gate terminal of the second complementary transistor T4 is connected to a first non-gate terminal of the second non-complementary transistor T2, the input of the inverter of the second part P2, and the gate terminal of the first complementary transistor T3. The second non-gate terminal of the first non-complementary transistor T1 and the second non-gate terminal of the second non-complementary transistor T2 receive the ground voltage VSS.

Referring to FIG. 1, in the voltage level shifter 100, a current may flow from the first voltage VDD1 terminal and/or the second voltage VDD2 terminal to a ground voltage VSS terminal. That is, the inverter included in the first part P1 is supplied with a current from the first voltage VDD1 terminal, and the inverter included in the second part P2 is supplied with a current from the second voltage VDD2 terminal. As described below with reference to FIG. 2, when the voltage level shifter 100 which is supplied with a plurality of different supply voltages is disposed on a substrate in an IC, the IC may include an excessively large area due to a spatial limitation. In particular, when a plurality of the voltage level shifters 100 are disposed on the substrate for processing bit data in parallel, the IC may have an excessively large area.

Figure 2:
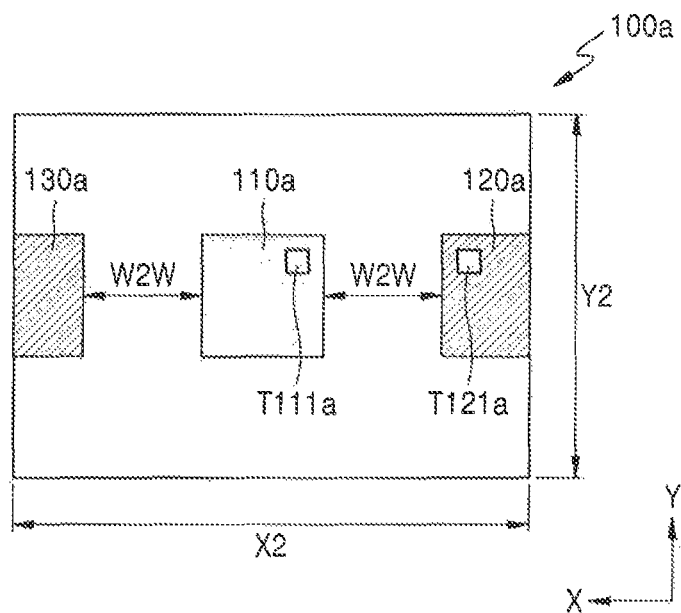
FIG. 2 is a diagram illustrating an example of a layout where a voltage level shifter of FIG. 1 is disposed on a substrate, according to an exemplary embodiment of the inventive concept.

FIG. 2 is a diagram illustrating an example of a layout where the voltage level shifter 100 of FIG. 1 is disposed on a substrate, according to an exemplary embodiment of the inventive concept. As illustrated in FIG. 2, the layout of the voltage level shifter 100 may configure one unit cell 100a.

As illustrated in FIG. 2, the unit cell 100a has a length X2 in an X axis direction and has a length Y2 in a Y axis direction. According to an exemplary embodiment, in order for another unit cell to be easily disposed adjacent to the unit cell 100a, the length Y2 is an integer multiple of a height (i.e., a length in the Y axis direction) of a standard cell. For example, the length Y2 may be two times the height of the standard cell.

Referring to FIG. 2, the unit cell 100a includes a first well 110a, a second well 120a, and a third well 130a. In an embodiment, a well is a region of a substrate which is doped with a conductive type different from that of a surrounding region so as to dispose a transistor and/or the like. For example, a first well 110a, a second well 120a, and a third well 130a illustrated in FIG. 2 may each be an N-well (or an N-type well) formed on a P-type substrate. When each of the first well 110a, the second well 120a, and the third well 130a is an N-well, a P-channel metal-oxide semiconductor field effect transistor (MOSFET) among a plurality of transistors included in the voltage level shifter 100 may be disposed in the first well 110a, the second well 120a, or the third well 130a. Hereinafter, exemplary embodiments where a well is an N-well formed on a P-type substrate will be described, but the inventive concept is not limited thereto. That is, according to an exemplary embodiment, a well may be a P-well (or a P-type well) formed on an N-type substrate, and accordingly an N-channel MOSFET may be disposed in the well.

As described above with reference to FIG. 1, the voltage level shifter 100 is supplied with a plurality of different supply voltages (for example, the first voltage VDD1 and the second voltage VDD2), and thus, the unit cell 100a is also supplied with the first voltage VDD1 and the second voltage VDD2. According to an exemplary embodiment, the first well 110a is biased to the first voltage VDD1, and the second well 120a and the third well 130a are biased to the second voltage VDD2. According to another exemplary embodiment, the first well 110a is biased to the second voltage VDD2, and the second well 120a and the third well 130a are biased to the first voltage VDD1. Hereinafter, the first well 110a being biased to the first voltage VDD1 and the second and third wells 120a and 130a being biased to the second voltage VDD2 will be described, but the inventive concept is not limited thereto. In the first part P1 of the voltage level shifter 100, a P-channel MOSFET (e.g., transistor T111a of FIG. 2) which is supplied with a current from the first voltage VDD1 terminal may be disposed in the first well 110a, and in the second part P2 of the voltage level shifter 100, a P-channel MOSFET (e.g., transistor T121a of FIG. 2) which is supplied with a current from the second voltage VDD2 terminal may be disposed in the second well 120a or the third well 130a. In an embodiment, the width of the first well 110a is greater than the width of the second well 120a or the third well 130a. In an embodiment, the width of the second and third wells 120a and 130a are the same or substantially the same as one another.

A layout of an IC may be based on a design rule, and the unit cell 100a may be disposed on a substrate, based on the design rule. The design rule may define a minimum size of each of features disposed on the substrate and a distance between the features and may include a plurality of values based on the characteristic of a semiconductor process of manufacturing an IC. Features of the unit cell 100a may be disposed to satisfy values defined by the design rule, for example, to correspond to a value greater than a defined value.

The design rule may include a well-to-well space rule, which defines a distance between wells having the same conductive type and a distance between wells having different conductive types or different bias voltages. As illustrated in FIG. 2, the first well 110a of the unit cell 100a is disposed to be spaced apart from each of the second and third wells 120a and 130a by a distance W2W or more. The distance W2W may be determined based on an effect caused by interference between wells.

According to the design rule, when other unit cells disposed near the unit cell 100a are supplied with the second voltage VDD2, the first well 110a biased to the first voltage VDD1 is disposed to be spaced apart from a boundary of the unit cell 100a. That is, another unit cell disposed near the unit cell 100a may include a well biased to the second voltage VDD2, and in order to satisfy the distance W2W between the well included in the other unit cell and the first well 110a which is included in the unit cell 100a and is biased to the first voltage VDD1, as illustrated in FIG. 2, the first well 110a is disposed to be spaced apart from the boundary of the unit cell 100a.

Referring to FIG. 2, the third well 130a may be formed for a circuit (for example, a unit cell) disposed adjacent to the unit cell 100a and may also be formed for minimizing a characteristic change of a cell caused by a well proximity effect. That is, although none one of transistors included in the voltage level shifter 100 is disposed in the third well 130a, the unit cell 100a may include the third well 130a for a well included in a unit cell disposed on the left of the unit cell 100a in FIG. 2.

As described above, the third well 130a is disposed to be spaced apart from the first well 110a by the distance W2W or more and may have a sufficient area for minimizing a characteristic change of a cell caused the well proximity effect in a circuit disposed adjacent thereto. Therefore, due to the third well 130a biased to the second voltage VDD2, the unit cell 100a may include an undesired space where an element (for example, a transistor) of a circuit necessary for an operation of the voltage level shifter 100 is not disposed. According to an exemplary embodiment, since a transistor is not disposed in the third well 130a, an area of the third well 130a may be reduced, or the third well 130a may be omitted. Since an undesired space is removed, an area of a unit cell corresponding to the voltage level shifter 100 is reduced, and since undesired biasing is not performed, power consumption of an IC may be reduced.

Figure 3A:
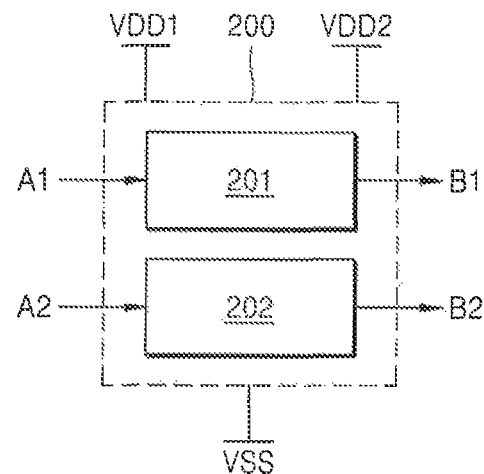
FIG. 3A is a block diagram of a voltage level shifter according to an exemplary embodiment of the inventive concept.
Figure 3B:
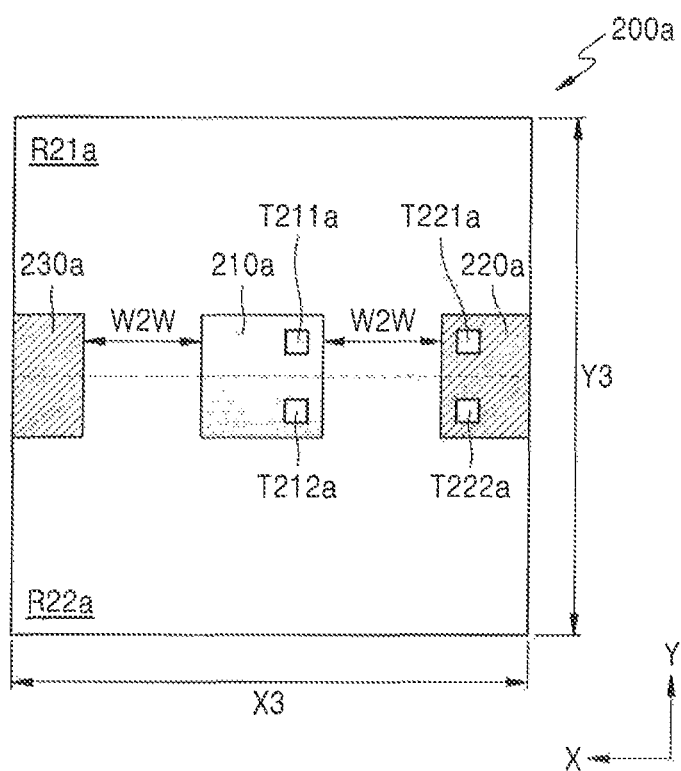
FIG. 3B is a diagram illustrating an example of a layout where the voltage level shifter of FIG. 3A is disposed on a substrate.

FIG. 3A is a block diagram of a voltage level shifter 200 according to an exemplary embodiment of the inventive concept, FIG. 3B is a diagram illustrating an example of a layout where the voltage level shifter 200 of FIG. 3A is disposed on a substrate. In detail, the voltage level shifter 200 illustrated in FIG. 3A may be referred to as a 2-bit voltage level shifter for processing two bit signals, and a layout of the voltage level shifter 200 may configure one unit cell 200a.

Referring to FIG. 3A, the voltage level shifter 200 includes a first bit circuit 201 and a second bit circuit 202. For example, each of the first and second bit circuits 201 and 202 may be the same as or similar to the voltage level shifter 100 of FIG. 1. The first bit circuit 201 receives a first input signal A1 to output a first output signal B1, and the second bit circuit 202 receives a second input signal A2 to output a second output signal B2. The first and second bit circuits 201 and 202 receive a first voltage VDD1 and a second voltage VDD2.

A plurality of bit signals may be processed in parallel for processing digital data including the plurality of bit signals, and to this end, the voltage level shifter 200 (or a voltage level shifter 400 of FIG. 4A or a voltage level shifter 500 of FIG. 5A) may process the plurality of bit signals in parallel. As described above, a voltage level shifter for processing a plurality of bit signals in parallel may be referred to as a multi-bit voltage level shifter.

Referring to FIG. 3B, the unit cell 200a has a length X3 in an X axis direction and has a length Y3 in a Y axis direction. As described above with reference to FIG. 2, the length Y3 is an integer multiple (for example, twice) of the height of the standard cell. The unit cell 200a includes a first well 210a, a second well 220a, and a third well 230a. The first well 210a may be biased to the first voltage VDD1 or the second voltage VDD2, and the second well 220a and the third well 230a may be biased to the second voltage VDD2 or the first voltage VDD1. Hereinafter, the first well 210a being biased to the first voltage VDD1 and the second and third wells 220a and 230a being biased to the second voltage VDD2 will be described, but the inventive concept is not limited thereto. The unit cell 200a includes the third well 230a where a transistor is not disposed, and thus, an area of the unit cell 200a may be reduced due to the reduced length X3. In an embodiment, the width of the first well 210a is larger than a width of the second well 220a or the third well 230a. In an embodiment, the width of the second and third wells 220a and 230a are the same or substantially the same as one another.

According to an exemplary embodiment, the first and second bit circuits 201 and 202 of FIG. 3A share the first well 210a and the second well 220a. For example, as illustrated in FIG. 3B, the unit cell 200a includes a first region R21a corresponding to the first bit circuit 201 and a second region R22a corresponding to the second bit circuit 202.

A transistor T211a among a plurality of transistors included in the first bit circuit 201 is disposed at a position where the first region R21a overlaps the first well 210a, and a transistor T212a among a plurality of transistors included in the second bit circuit 202 is disposed at a position where the second region R22a overlaps the first well 210a. Also, a transistor T221a among the plurality of transistors included in the first bit circuit 201 is disposed at a position where the first region R21a overlaps the second well 220a, and a transistor T222a among the plurality of transistors included in the second bit circuit 202 is disposed at a position where the second region R22a overlaps the second well 220a.

Layouts respectively corresponding to the first and second bit circuits 201 and 202 share the first well 210a and the second well 220a, and thus, the unit cell 200a corresponding to the layout of the voltage level shifter 200 may have a reduced area. That is, an area of the unit cell 200a of FIG. 3B may be smaller than an area occupied by two of the unit cells 100a of FIG. 2 which are disposed adjacent to each other, so that the voltage level shifter 200 for processing 2-bit signals is disposed on a substrate.

Figure 4A:
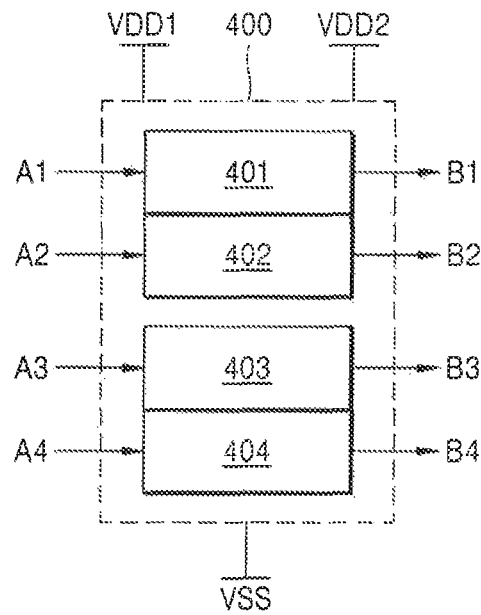
FIG. 4A is a block diagram of a voltage level shifter according to an exemplary embodiment of the inventive concept.
Figure 4B:
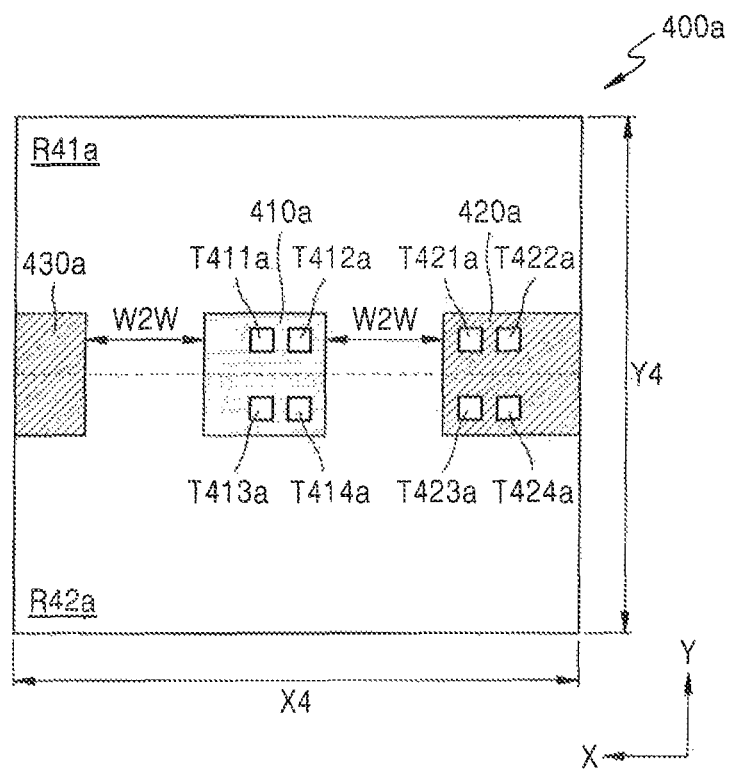
FIG. 4B is a diagram illustrating an example of a layout where the voltage level shifter of FIG. 4A is disposed on a substrate.

FIG. 4A is a block diagram of a voltage level shifter 400 according to an exemplary embodiment of the inventive concept, and FIG. 4B is a diagram illustrating an example of a layout where the voltage level shifter 400 of FIG. 4A is disposed on a substrate. In detail, the voltage level shifter 400 illustrated in FIG. 4A may be referred to as a 4-bit voltage level shifter for processing four bit signals, and a layout of the voltage level shifter 400 may configure one unit cell 400a.

Referring to FIG. 4A, the voltage level shifter 400 includes first to fourth bit circuits 401 to 404. For example, each of the first to fourth bit circuits 401 to 404 may be the same as or similar to the voltage level shifter 100 of FIG. 1. The first to fourth bit circuits 401 to 404 respectively receive first to fourth input signals A1 to A4 and respectively output first to fourth output signals B1 to B4. Also, the first to fourth bit circuits 401 to 404 receive a first voltage VDD1 and a second voltage VDD2.

Referring to FIG. 4B, the unit cell 400a has a length X4 in an X axis direction and has a length Y4 in a Y axis direction. The length Y4 may be an integer multiple (for example, twice) of the height of the standard cell. The unit cell 400a includes a first well 410a, a second well 420a, and a third well 430a. The first well 410a may be biased to the first voltage VDD1 or the second voltage VDD2, and the second well 420a and the third well 430a may be biased to the second voltage VDD2 or the first voltage VDD1. Hereinafter, the first well 410a being biased to the first voltage VDD1 and the second and third wells 420a and 430a being biased to the second voltage VDD2 will be described, but the inventive concept is not limited thereto. The unit cell 400a include the third well 430a where a transistor is not disposed, and thus, an area of the unit cell 400a may be reduced due to the reduced length X4. In an embodiment, the width of the third well 430a is less than the width of the first well 410a or the second well 420a.

According to an exemplary embodiment, the first to fourth bit circuits 401 to 404 of FIG. 4A share the first well 410a and the second well 420a. For example, as illustrated in FIG. 4B, the unit cell 400a includes a first region R41a corresponding to the first and second bit circuits 401 and 402 and a second region R42a corresponding to the third and fourth bit circuits 403 and 404.

A plurality of transistors T411a and T412a among a plurality of transistors included in each of the first and second bit circuits 401 and 402 are disposed at a position where the first region R41a overlaps the first well 410a, and a plurality of transistors T413a and T414a among a plurality of transistors included in each of the third and fourth bit circuits 403 and 404 are disposed at a position where the second region R42a overlaps the first well 410a. Also, a plurality of transistors T421a and T422a among a plurality of transistors included in each of the first and second bit circuits 401 and 402 are disposed at a position where the first region R41a overlaps the second well 420a, and a plurality of transistors T423a and T424a among a plurality of transistors included in each of the third and fourth bit circuits 403 and 404 are disposed at a position where the second region R42a overlaps the second well 420a.

Layouts respectively corresponding to the first to fourth bit circuits 401 to 404 share the first well 410a and the second well 420a, and thus, the unit cell 400a corresponding to the layout of the voltage level shifter 400 may have a reduced area. That is, an area of the unit cell 400a of FIG. 4B may be smaller than an area, occupied by four the unit cells 100a of FIG. 2 which are disposed adjacent to each other, or an area occupied by two of the unit cells 200a of FIG. 3B which are disposed adjacent to each other, so that the voltage level shifter 400 for processing 4-bit signals is disposed on a substrate.

Figure 5A:
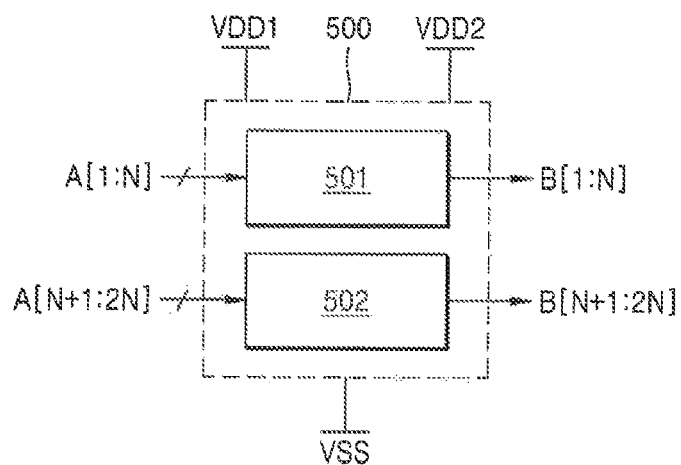
FIG. 5A is a block diagram of a voltage level shifter according to an exemplary embodiment of the inventive concept.
Figure 5B:
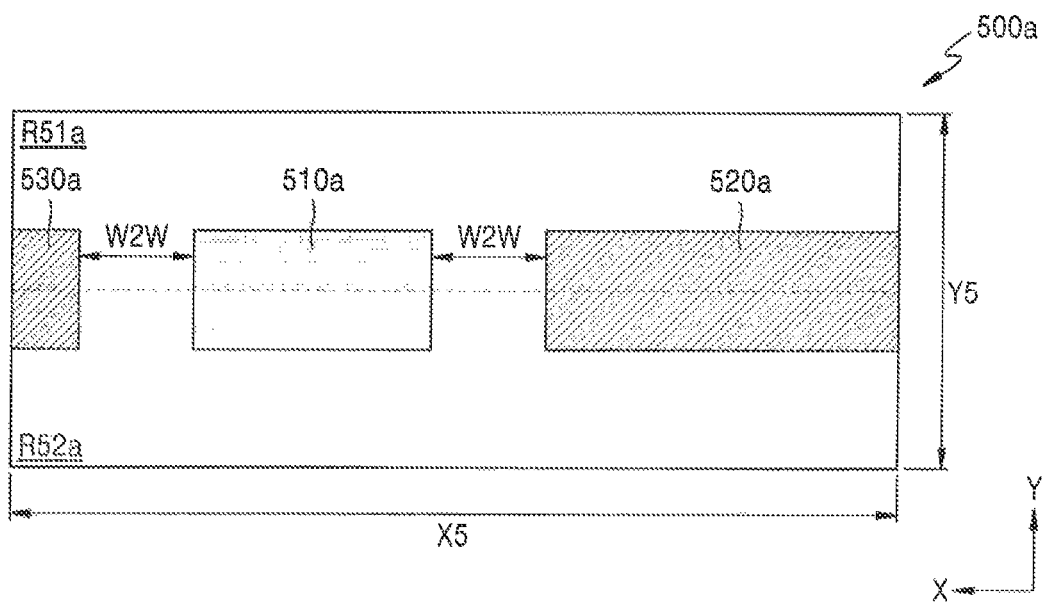
FIG. 5B is a diagram illustrating an example of a layout where the voltage level shifter of FIG. 5A is disposed on a substrate.

FIG. 5A is a block diagram of a voltage level shifter 500 according to an exemplary embodiment of the inventive concept, and FIG. 5B is a diagram illustrating an example of a layout where the voltage level shifter 500 of FIG. 5A is disposed on a substrate. In detail, the voltage level shifter 500 illustrated in FIG. 5A may be referred to as a 2N-bit voltage level shifter for processing 2N number of bit signals, and a layout of the voltage level shifter 500 may configure one unit cell 500a. N is an integer greater than 0. For example, when N is 4, the voltage level shifter 500 is capable of processing 8 bit signals.

Referring to FIG. 5A, the voltage level shifter 500 includes a first multi-bit circuit 501 and a second multi-bit circuit 502. For example, each of the first multi-bit circuit 501 and the second multi-bit circuit 502 may include N number of circuits which are the same as or similar to the voltage level shifter 100 of FIG. 1. The first multi-bit circuit 501 and the second multi-bit circuit 502 receive N number of first input signals A[1:N] and N number of second input signals A[N+1:2N] and output N number of first output signals B[1:N] and N number of second input signals B[N+1:2N]. Also, the first multi-bit circuit 501 and the second multi-bit circuit 502 are supplied with a first voltage VDD1 and a second voltage VDD2.

Referring to FIG. 5B, the unit cell 500a has a length X5 in an X axis direction and has a length Y5 in a Y axis direction. The length Y5 may be an integer multiple (for example, twice) of the height of the standard cell. The unit cell 500a includes a first well 510a, a second well 520a, and a third well 530a. The first well 510a may be biased to the first voltage VDD1 or the second voltage VDD2, and the second well 520a and the third well 530a may be biased to the second voltage VDD2 or the first voltage VDD1. Hereinafter, the first well 510a being biased to the first voltage VDD1 and the second and third wells 520a and 530a being biased to the second voltage VDD2 will be described, but the inventive concept is not limited thereto. The unit cell 500a includes the third well 530a where a transistor is not disposed, and thus, an area of the unit cell 500a may be reduced due to the reduced length X5. In an embodiment, the width of the third well 530a is less than the width of the first well 510a or the second well 520a.

According to an exemplary embodiment, the first and second multi-bit circuits 501 and 502 of FIG. 5A share the first well 510a and the second well 520a. For example, as illustrated in FIG. 5B, the unit cell 500a includes a first region R51a corresponding to the first multi-bit circuit 501 and a second region R52a corresponding to the second multi-bit circuit 502.

A P-channel MOSFET, which is supplied with a current from a first voltage VDD1 terminal, among a plurality of transistors included in the first multi-bit circuit 501, is disposed at a position where the first region R51a overlaps the first well 510a, and a P-channel MOSFET, which is supplied with a current from the first voltage VDD1 terminal, among a plurality of transistors included in the second multi-bit circuit 502, is disposed at a position where the second region R52a overlaps the first well 510a. Also, a P-channel MOSFET, which is supplied with a current from a second voltage VDD2 terminal, among a plurality of transistors included in the first multi-bit circuit 501, is disposed at a position where the first region R51a overlaps the second well 520a, and a P-channel MOSFET, which is supplied with a current from the second voltage VDD2 terminal, among a plurality of transistors included in the second multi-bit circuit 502, is disposed at a position where the second region R52a overlaps the second well 520a.

Layouts respectively corresponding to the first multi-bit circuit 501 and the second multi-bit circuit 502 share the first well 510a and the second well 520a, and thus, the unit cell 500a corresponding to the layout of the voltage level shifter 500 may have a reduced area. That is, an area of the unit cell 500a of FIG. 5B may be smaller than an area, occupied by a layout which includes wells respectively biased to the first and second voltages VDD1 and VDD2 and corresponds to the first multi-bit circuit 501, and an area occupied by a layout which includes wells respectively biased to the first and second voltages VDD1 and VDD2 and corresponds to the second multi-bit circuit 502.

Figure 6:
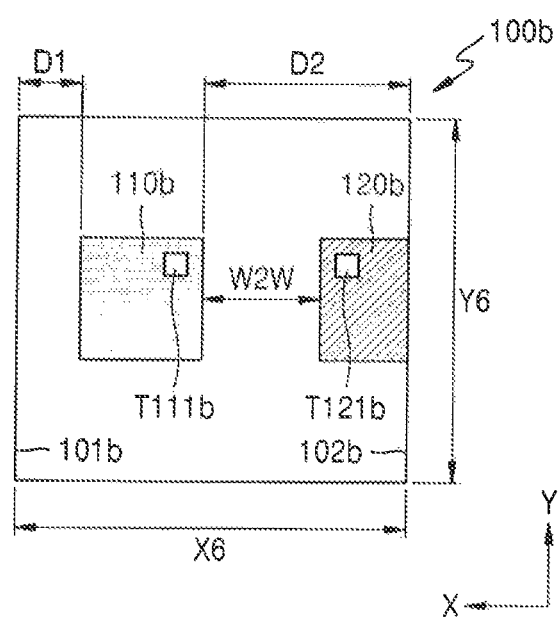
FIG. 6 is a diagram illustrating an example of a layout where the voltage level shifter of FIG. 1 is disposed on a substrate, according to an exemplary embodiment of the inventive concept.

FIG. 6 is a diagram illustrating an example of a layout where the voltage level shifter 100 of FIG. 1 is disposed on a substrate, according to an exemplary embodiment of the inventive concept. Similar to FIG. 2, a layout of the voltage level shifter 100 may configure one unit cell 100b.

As illustrated in FIG. 6, the unit cell 100b has a length X6 in an X axis direction and has a length Y6 in a Y axis direction. As described above with reference to FIG. 2, the length Y6 may be an integer multiple (for example, twice) of the height of the standard cell.

Referring to FIG. 6, the unit cell 100b according to an exemplary embodiment includes a first well 110b and a second well 120b. The first well 110b and the second well 120b may be respectively biased to the first voltage VDD1 and the second voltage VDD2. Also, the first well 110b and the second well 120b are spaced apart from each other by a distance W2W according to the design rule. In the first part P1 of the voltage level shifter 100, a P-channel MOSFET (e.g., T111b of FIG. 6) which is supplied with a current from the first voltage VDD1 terminal is disposed in the first well 110b, and in the second part P2 of the voltage level shifter 100, a P-channel MOSFET (e.g., T121b of FIG. 6) which is supplied with a current from the second voltage VDD2 terminal is disposed in the second well 120b. In an embodiment, the width of the second well 120b is less than the width of the first well 110b.

Referring to FIG. 6, in comparison with the unit cell 100a of FIG. 2, the unit cell 100b of FIG. 6 includes two wells 110b and 120b which are separated from each other. That is, a well (for example, the third well 130a of FIG. 2) where an element of a circuit necessary for an operation of the voltage level shifter 100 is not disposed is omitted, and thus, the unit cell 100b of FIG. 6 may have an area smaller than that of the unit cell 100a of FIG. 2. That is, the length Y6 of FIG. 6 may be equal to the length Y2 of FIG. 2, and the length X6 of FIG. 6 is smaller than the length X2 of FIG. 2. Also, in FIG. 6, a distance D1 by which the first well 110b is spaced apart from a left side 101b (a first side or edge) of the unit cell 100b is smaller than a distance D2 by which the first well 110b is spaced apart from a right side 102b (a second side) of the unit cell 100b.

As described below, the unit cell 100b may be disposed on an edge of a block of an IC. For example, in FIG. 6, the unit cell 100b may be disposed in order for a left side of the unit cell 100b to contact an edge of a block (e.g., another unit cell), and thus, a well for a unit cell disposed adjacent to the unit cell 100b may be removed from the unit cell 100b. An area of the unit cell 100b of FIG. 6 may be reduced by about 40% of an area of the unit cell 100a of FIG. 2.

Figure 7:
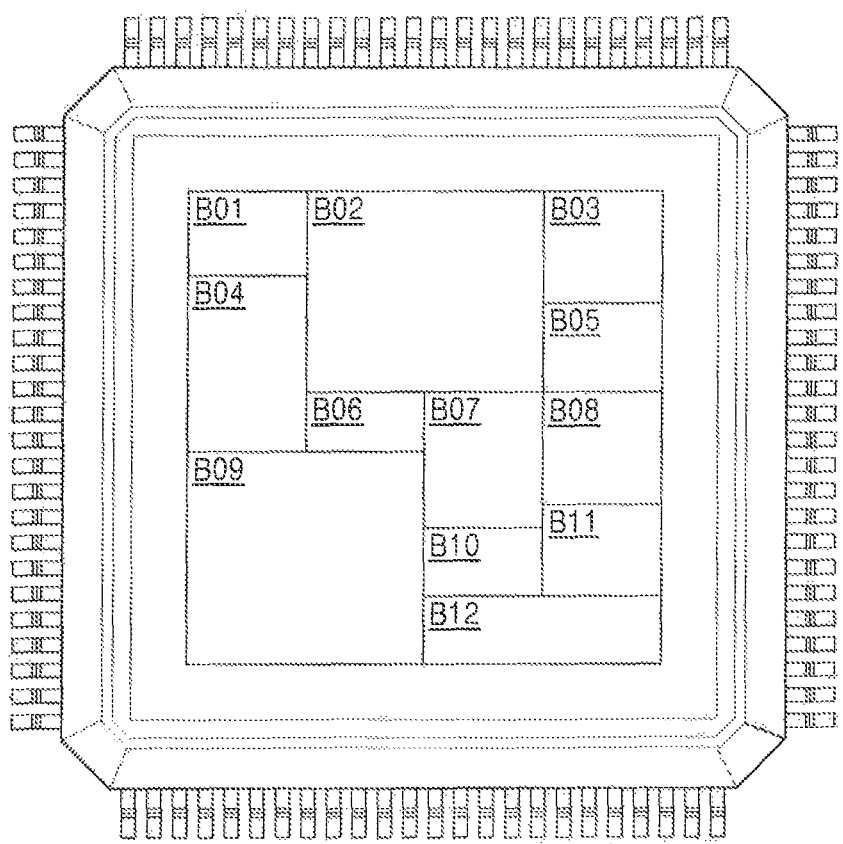
FIG. 7 is a diagram schematically illustrating a semiconductor device including an IC including a plurality of blocks.

FIG. 7 is a diagram schematically illustrating a semiconductor device 1000 including an IC including a plurality of blocks (e.g., unit cells). The semiconductor device 1000 is not limited to the type illustrated in FIG. 7. For example, the semiconductor device 1000 may be another type of semiconductor device such as a package type, which may include a ball grid array (BGA)).

Referring to FIG. 7, an IC included in the semiconductor device 1000 is configured with a plurality of blocks B01 to B12. Each of the blocks B01 to B12 may be a unit of a layout of an IC which is produced by a designer of the IC or a semiconductor design tool to perform at least one function. For example, the IC included in the semiconductor device 1000 may be manufactured by arranging the plurality of blocks B01 to B12, respectively designed by a plurality of designers, on a substrate. Each of the blocks B01 to B12 may include at least one element, for example, a transistor, a resistor, a capacitor, a diode, and/or the like. Particularly, a block processing digital signals among the plurality of blocks B01 to B12 may be configured with a plurality of unit cells on a substrate.

A block including a plurality of unit cells may include an edge cell which denotes a unit cell disposed on an edge of the block. Since the edge cell is disposed on the edge of the block, a characteristic change of a cell caused by the well proximity effect is minimized, a tap for maintaining an electric potential of each of an N-region and a P-region is provided, a well antenna that previously extracts an electric charge surrounded by a well in a process of manufacturing a semiconductor device is provided, and a termination gate line which has a broad width for termination of gate lines arranged in the block is provided. For example, in a boundary between a second block B02 and a third block B03, the second block B02 may include a plurality of edge cells arranged on an edge of the second block B02, and the third block B03 may include a plurality of edge cells arranged on an edge of the third block B03.

According to an exemplary embodiment, since a unit cell corresponding to the layout of the voltage level shifter 100 of FIG. 1 is disposed on an edge of a block, the unit cell may function as an edge cell and may have a reduced area. Hereinafter, exemplary embodiments relevant to the unit cell of the voltage level shifter 100 disposed on an edge of a block will be described with reference to FIGS. 8A and 8B.

Figure 8A:
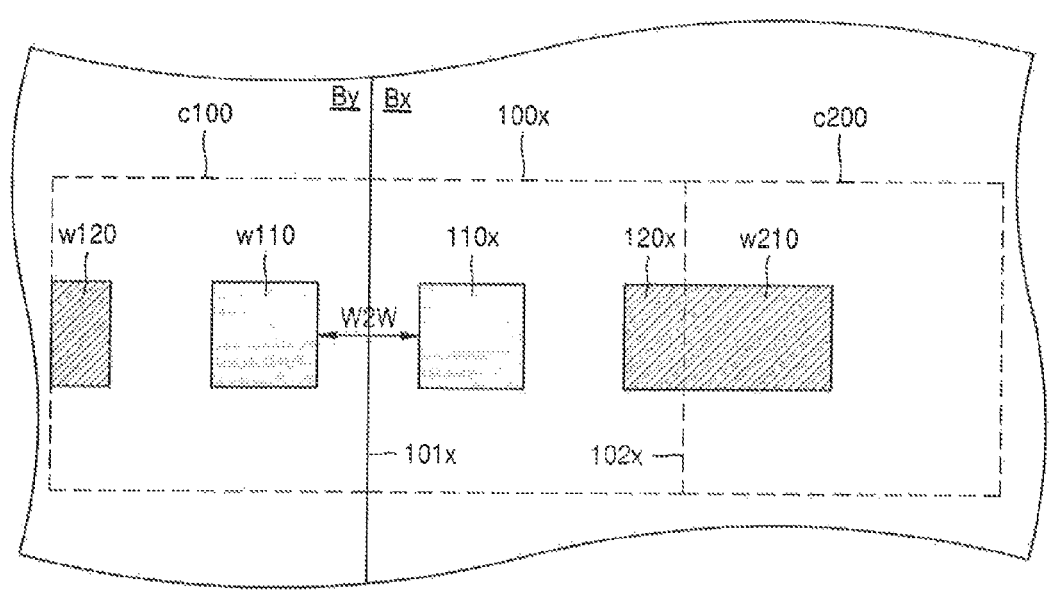
FIGS. 8A and 8B are diagrams illustrating unit cells of a voltage level shifter disposed on an edge of a block according to an exemplary embodiment of the inventive concept.
Figure 8B:
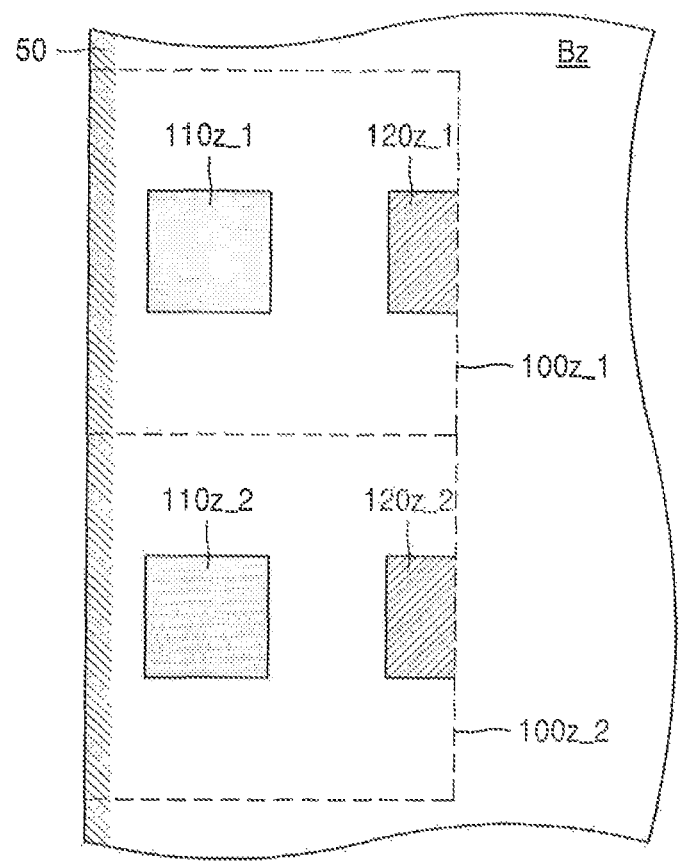

FIGS. 8A and 8B are diagrams illustrating unit cells of a voltage level shifter 100 disposed on an edge of a block according to exemplary embodiments of the inventive concept. In FIGS. 8A and 8B, a plurality of unit cells 100x, 100z_1 and 100z_2 may each correspond to the layout of the voltage level shifter 100 of FIG. 1.

Referring to FIG. 8A, a block Bx includes a unit cell 100x, which is disposed on an edge of the block Bx in a boundary between the block Bx and a block By, and a unit cell C200 disposed adjacent to the unit cell 100x. The unit cell 100x may be an edge cell of the block Bx, and similar to the unit cell 100b of FIG. 6, the unit cell 100x includes a first well 110x and a second well 120x. The first well 110x and the second well 120x may be respectively biased to a first voltage VDD1 and a second voltage VDD2. In an embodiment, the width of the second well 120x is less than the width of the first well 110x.

As illustrated in FIG. 8A, the second well 120x of the unit cell 100x is disposed to contact a side 102x (a second side) facing a side 101x (a first side) of the unit cell 100x contacting the edge of the block Bx. The second well 120x is connected to a well w210 of a unit cell c200 biased to a second voltage VDD2. That is, the second well 120x of the unit cell 100x and the well w210 of the unit cell C200 are disposed to contact the side 102x of the unit cell 100x in consideration of unit cells disposed adjacent thereto. The second well 120x and the well w210 may be respectively included in the different unit cells 100x and C200, but may be provided to configure one cell.

The block By includes a unit cell c100 which is disposed on an edge of the block By in the boundary between the block By and the block Bx. The unit cell c100 may be an edge cell of the block By, and similar to the unit cell 100b of FIG. 6, the unit cell c100 includes a first well w110 and a second well w120. The first well w110 and the second well w120 may be respectively biased to the first voltage VDD1 and the second voltage VDD2, or may be respectively biased to a third voltage and a fourth voltage which differ from the first voltage VDD1 and the second voltage VDD2. That is, the unit cell c100 may be a unit cell corresponding to the layout of the voltage level shifter 100 included in the block By. In an embodiment, the width of the second well w120 is less than the width of the first well w110.

As illustrated in FIG. 8A, the first well 110x of the unit cell 100x and the first well w110 of the unit cell C100 are spaced apart from each other by a distance W2W according to the design rule. Therefore, in the unit cell 100x, the first well 110x may be spaced apart from the side 101x (the first side) of the unit cell 100x contacting the edge of the block Bx by half or more of the distance W2W. Also, in the unit cell c100, the first well w110 may be spaced apart from the side of the unit cell c100 contacting the edge of the block By by half or more of the distance W2W. That is, referring to FIG. 6, according to an exemplary embodiment, the distance D1 is half or more of the distance W2W.

Referring to FIG. 8B, a block Bz includes a plurality of unit cells 100z_1 and 100z2, disposed on an edge of the block Bz, and a termination gate line 50. The unit cell 100z_1 may correspond to the layout of the voltage level shifter 100 and includes two wells 110z_1 and 120z_1 biased to different voltages. The unit cell 100z_2 may also correspond to the layout of the voltage level shifter 100 and includes two wells 110z_2 and 120z_2 biased to different voltages. In an embodiment, the width of well 120z_1 is less than the width of well 110z_1, and the width of well 120z_2 is less than the width of well 110z_2.

In an embodiment, for termination of gate lines arranged in the block Bz, a termination gate line 50 has a width broader than that of each of gate lines configuring gates of transistors in the block Bz, and an edge cell includes a portion of the termination gate line 50 which is formed along the edge of the block Bz. According to an exemplary embodiment, each of the unit cells 100z_1 and 100z_2 corresponding to the layout of the voltage level shifter 100 is an edge cell and includes a portion of the termination gate line 50 which is formed along the edge of the block Bz.

Figure 9:
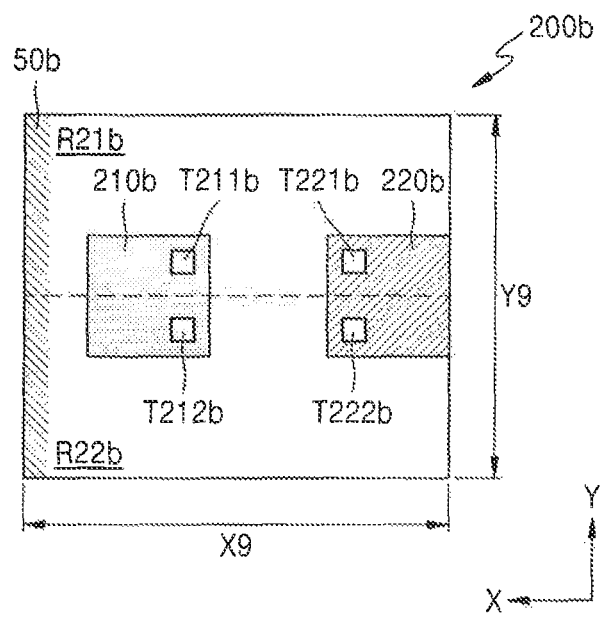
FIG. 9 is a diagram illustrating an example of a layout where the voltage level shifter of FIG. 3A is disposed on a substrate, according to an exemplary embodiment of the inventive concept.

FIG. 9 is a diagram illustrating an example of a layout where the voltage level shifter 200 of FIG. 3A is disposed on a substrate, according to an exemplary embodiment of the inventive concept. A layout of a 2-bit voltage level shifter 200 may configure one unit cell 200b.

Referring to FIG. 9, the unit cell 200b has a length X9 in an X axis direction and has a length Y9 in a Y axis direction. As described above with reference to FIG. 2, the length Y9 may be an integer multiple (for example, twice) of the height of the standard cell. The unit cell 200b includes a first well 210b biased to a first voltage VDD1, a second well 220b biased to a second voltage VDD2, and a termination gate line 50b. The unit cell 200b may be disposed on an edge of a block, and an undesired space (for example, a well which is biased to the second voltage VDD2 and is disposed on the left of the first well 210b) may be omitted. Therefore, an area of the unit cell 200b is reduced due to the reduced length X9.

According to an exemplary embodiment, the first and second bit circuits 201 and 202 of FIG. 3A share a first well 210b and a second well 220b. For example, as illustrated in FIG. 9, the unit cell 200b includes a first region R21b corresponding to the first bit circuit 201 and a second region R22b corresponding to the second bit circuit 202.

A transistor T211b among the plurality of transistors included in the first bit circuit 201 are disposed at a position where the first region R21b overlaps the first well 210b, and a transistor T212b among the plurality of transistors included in the second bit circuit 202 are disposed at a position where the second region R22b overlaps the first well 210b. Also, a transistor T221b among the plurality of transistors included in the first bit circuit 201 are disposed at a position where the first region R21b overlaps the second well 220b, and a transistor T222b among the plurality of transistors included in the second bit circuit 202 are disposed at a position where the second region R22b overlaps the second well 220b.

The layouts respectively corresponding to the first and second bit circuits 201 and 202 share the first well 210b and the second well 220b, and thus, the unit cell 200b corresponding to the layout of the voltage level shifter 200 may have a reduced area. That is, an area of the unit cell 200b of FIG. 9 may be smaller than an area occupied by two of the unit cells 100b of FIG. 6 which are disposed adjacent to each other, so that the voltage level shifter 200 for processing 2-bit signals is disposed on a substrate.

Figure 10:
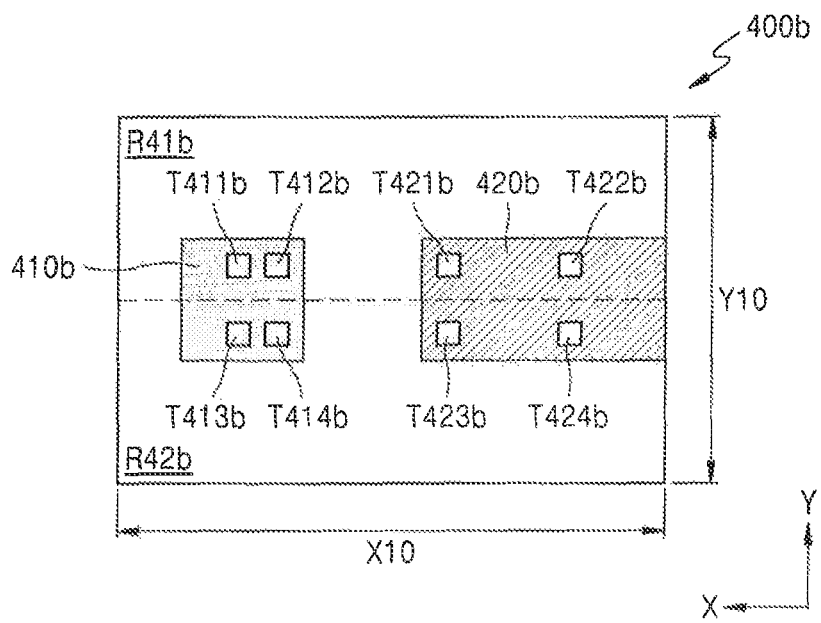
FIG. 10 is a diagram illustrating an example of a layout where the voltage level shifter of FIG. 4A is disposed on a substrate, according to an exemplary embodiment of the inventive concept.

FIG. 10 is a diagram illustrating an example of a layout where the voltage level shifter 400 of FIG. 4A is disposed on a substrate, according to an exemplary embodiment of the inventive concept. A layout of a 4-bit voltage level shifter 400 may configure one unit cell 400b.

Referring to FIG. 10, the unit cell 400b has a length X10 in an X axis direction and has a length Y10 in a Y axis direction. The length Y10 may be an integer multiple (for example, twice) of the height of the standard cell. The unit cell 400b includes a first well 410b biased to a first voltage VDD1 and a second well 420b biased to a second voltage VDD2. Also, although not shown in FIG. 10, the unit cell 400b may further include a termination gate line and may be disposed on an edge of a block. Therefore, in the unit cell 400b, an undesired space may be omitted, and an area of the unit cell 400b is reduced due to the reduced length X10. In an embodiment, the width of the first well 410b is less than the width of the second well 420b.

According to an exemplary embodiment, the first to fourth bit circuits 401 to 404 of FIG. 4A share the first well 410b and the second well 420b. For example, as illustrated in FIG. 10, the unit cell 400b includes a first region R41b corresponding to the first and second bit circuits 401 and 402 and a second region R42b corresponding to the third and fourth bit circuits 403 and 404.

A plurality of transistors T411b and T412b among the plurality of transistors included in each of the first and second bit circuits 401 and 402 are disposed at a position where the first region R41b overlaps the first well 410b, and a plurality of transistors T413b and T414b among the plurality of transistors included in each of the third and fourth bit circuits 403 and 404 are disposed at a position where the second region R42b overlaps the first well 410b. Also, a plurality of transistors T421b and T422b among the plurality of transistors included in each of the first and second bit circuits 401 and 402 are disposed at a position where the first region R41b overlaps the second well 420b, and a plurality of transistors T423b and T424b among a plurality of transistors included in each of the third and fourth bit circuits 403 and 404 are disposed at a position where the second region R42b overlaps the second well 420b.

The layouts respectively corresponding to the first to fourth bit circuits 401 to 404 share the first well 410b and the second well 420b, and thus, the unit cell 400b corresponding to the layout of the voltage level shifter 400 may have a reduced area. That is, an area of the unit cell 400b of FIG. 10 may be smaller than an area, occupied by four of the unit cells 100b of FIG. 6 which are disposed adjacent to each other, or an area occupied by two of the unit cells 200b of FIG. 9 which are disposed adjacent to each other, so that the voltage level shifter 400 for processing 4-bit signals is disposed on a substrate.

Figure 11:
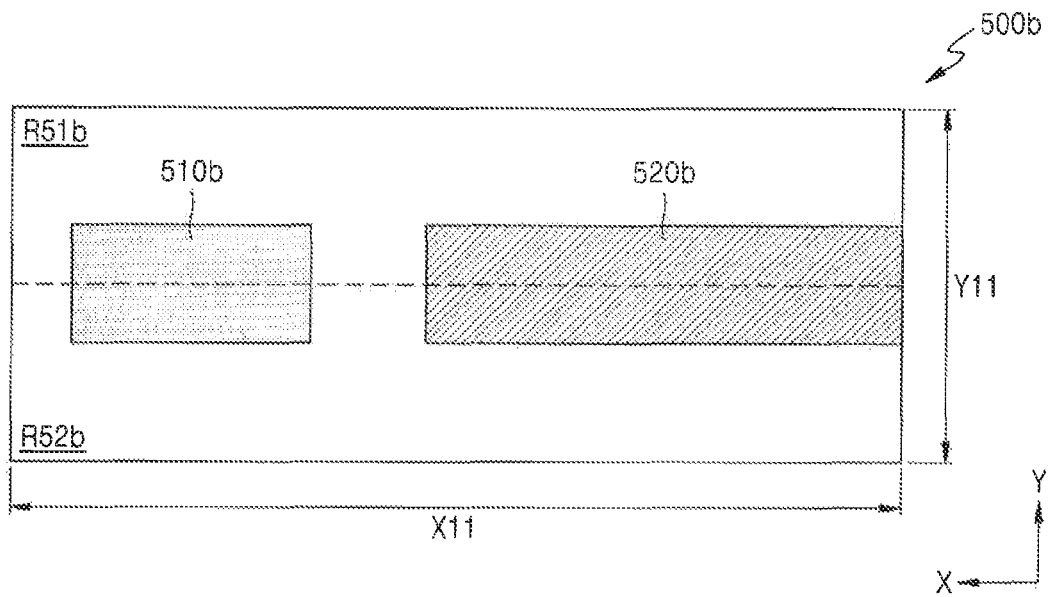
FIG. 11 is a diagram illustrating an example of a layout where the voltage level shifter of FIG. 5A is disposed on a substrate, according to an exemplary embodiment of the inventive concept.

FIG. 11 is a diagram illustrating an example of a layout where the voltage level shifter 500 of FIG. 5A is disposed on a substrate, according to an exemplary embodiment of the inventive concept. A layout of an 2N-bit voltage level shifter 500 may configure one unit cell 500b.

Referring to FIG. 11, the unit cell 500b has a length X11 in an X axis direction and has a length Y11 in a Y axis direction. The length Y11 may be an integer multiple (for example, twice) of the height of the standard cell. The unit cell 500b includes a first well 510b biased to a first voltage VDD1 and a second well 520b biased to a second voltage VDD2. Also, although not shown in FIG. 11, the unit cell 500b may further include a termination gate line and may be disposed on an edge of a block. Therefore, in the unit cell 500b, an undesired space may be omitted, and an area of the unit cell 500b is reduced due to the reduced length X11. In an embodiment, the width of the first well 510b is less than the width of the second well 520b.

According to an exemplary embodiment, the first and second multi-bit circuits 501 and 502 of FIG. 5A share the first well 510b and the second well 520b. For example, as illustrated in FIG. 11, the unit cell 500b includes a first region R51b corresponding to the first multi-bit circuit 501 and a second region R52b corresponding to the second multi-bit circuit 502.

A P-channel MOSFET, which is supplied with a current from a first voltage VDD1 terminal, among the plurality of transistors included in the first multi-bit circuit 501, may be disposed at a position where the first region R51b overlaps the first well 510b, and a P-channel MOSFET, which is supplied with a current from the first voltage VDD1 terminal, among the plurality of transistors included in the second multi-bit circuit 502, may be disposed at a position where the second region R52b overlaps the first well 510b. Also, a P-channel MOSFET, which is supplied with a current from a second voltage VDD2 terminal, among the plurality of transistors included in the first multi-bit circuit 501, may be disposed at a position where the first region R51b overlaps the second well 520b, and a P-channel MOSFET, which is supplied with a current from the second voltage VDD2 terminal, among the plurality of transistors included in the second multi-bit circuit 502, may be disposed at a position where the second region R52b overlaps the second well 520b.

The layouts respectively corresponding to the first multi-bit circuit 501 and the second multi-bit circuit 502 share the first well 510b and the second well 520b, and thus, the unit cell 500b corresponding to the layout of the voltage level shifter 500 may have a reduced area. That is, an area of the unit cell 500b of FIG. 11 may be smaller than an area, occupied by a layout which includes wells respectively biased to the first and second voltages VDD1 and VDD2 and corresponds to the first multi-bit circuit 501, and an area occupied by a layout which includes wells respectively biased to the first and second voltages VDD1 and VDD2 and corresponds to the second multi-bit circuit 502.

Figure 12:
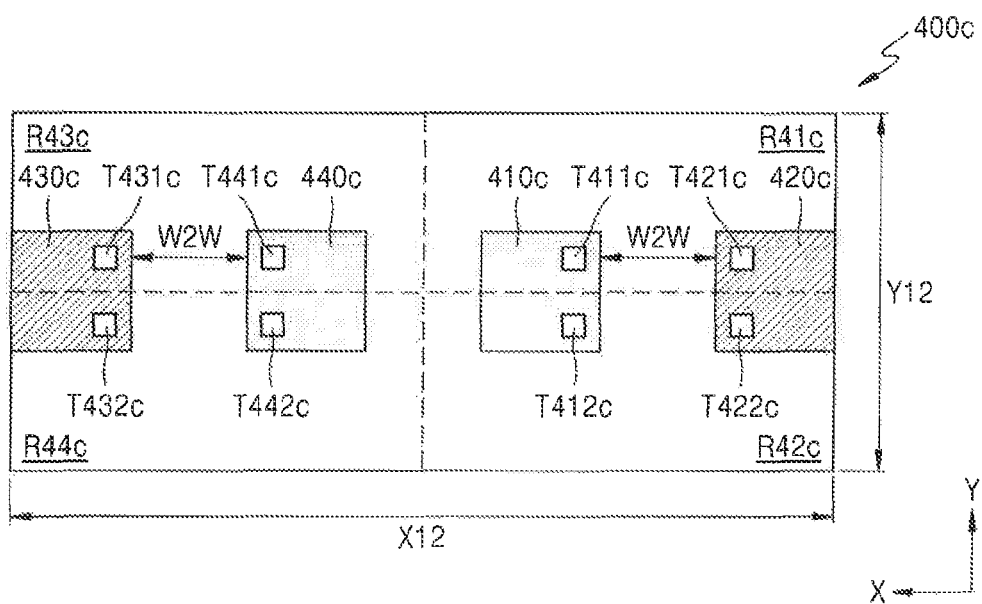
FIG. 12 is a diagram illustrating an example of a layout where the voltage level shifter of FIG. 4A is disposed on a substrate, according to an exemplary embodiment of the inventive concept.

FIG. 12 is a diagram illustrating an example of a layout where the voltage level shifter of FIG. 4A is disposed on a substrate, according to an exemplary embodiment of the inventive concept. A layout of the 4-bit voltage level shifter 400 may configure one unit cell 400c.

Referring to FIG. 12, the unit cell 400c has a length X12 in an X axis direction and has a length Y12 in a Y axis direction. The length Y12 may be an integer multiple (for example, twice) of the height of the standard cell. The unit cell 400c includes first and fourth wells 410c and 440c biased to a first voltage VDD1 and second and third wells 420c and 430c biased to a second voltage VDD2. For example, the unit cell 400c may be configured by merging the layout of the unit cell of FIG. 9 with a layout which is symmetrical about the unit cell 200b with respect to the axis parallel to a Y axis.

According to an exemplary embodiment, the first and second bit circuits 401 and 402 of FIG. 4A share a first well 410c and a second well 420c, and the third and fourth bit circuits 403 and 404 share a third well 430c and a fourth well 440c. For example, as illustrated in FIG. 12, the unit cell 400c may be configured with first to fourth regions R41c to R44c respectively corresponding to the first to fourth bit circuits 401 to 404. For example, the first region R41c may be symmetrical about the third region R43c with respect to an axis parallel to the Y axis, and the second region R42c may be symmetrical about the fourth region R44c with respect to the axis parallel to the Y axis.

A transistor T411c is disposed at a position where the first region R41c overlaps the first well 410c, and a transistor T412c is disposed at a position where the second region R42c overlaps the second well 420c. Also, a transistor T421c is disposed at a position where the first region R41c overlaps the second well 420c, and a transistor T422c is disposed at a position where the second region R42c overlaps the second well 420c. A transistor T431c is disposed at a position where the third region R43c overlaps the third well 430c, and a transistor T432c is disposed at a position where the fourth region R44c overlaps the third well 430c. Also, a transistor T441c is disposed at a position where the third region R43c overlaps the fourth well 440c, and a transistor T442c is disposed at a position where the fourth region R44c overlaps the fourth well 440c.

As illustrated in FIG. 12, by symmetrically arranging two unit cells, a layout of a multi-bit voltage level shifter may be disposed in a block as well as an edge of the block. That is, in FIG. 12, the second well 420c and the third well 430c respectively contacting a pair of opposite sides in a boundary of the unit cell 400c may be connected to wells included in other unit cells which are disposed on the left and the right to be adjacent to the unit cell 400c, and a characteristic change of a cell caused by the well proximity effect may be minimized.

Figure 13:
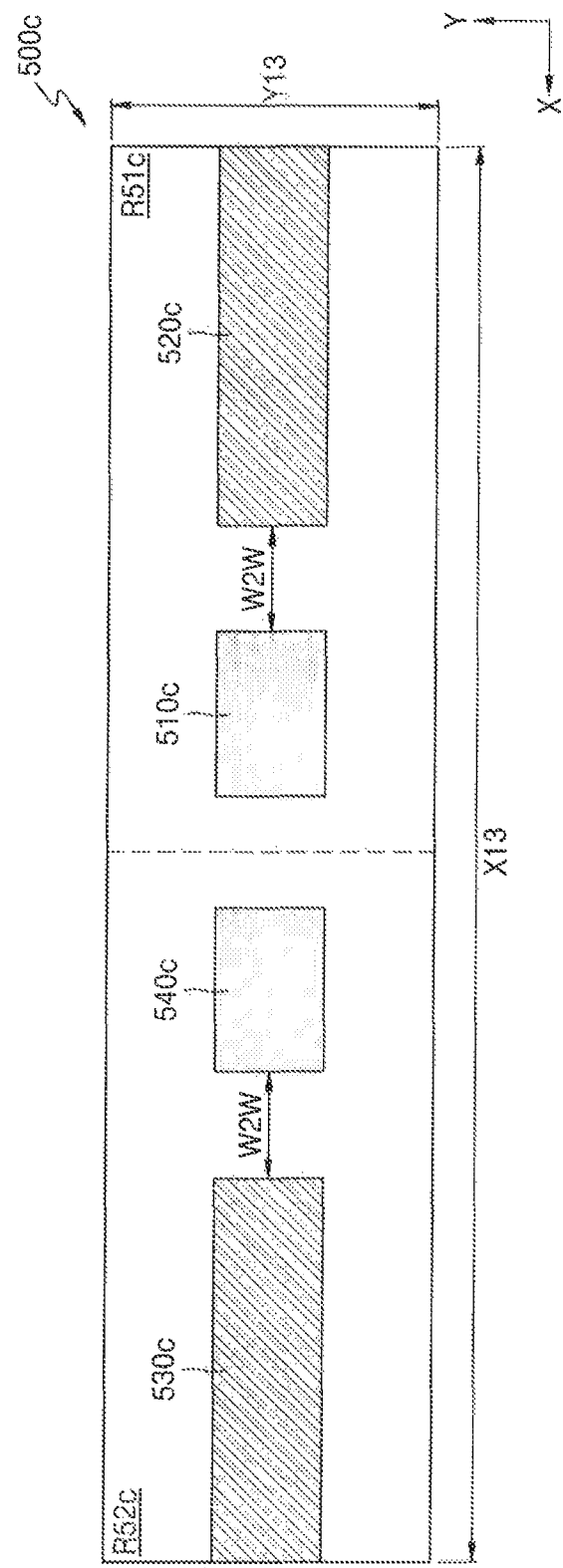
FIG. 13 is a diagram illustrating an example of a layout where the voltage level shifter of FIG. 5A is disposed on a substrate, according to an exemplary embodiment of the inventive concept.

FIG. 13 is a diagram illustrating an example of a layout where the voltage level shifter 500 of FIG. 5A is disposed on a substrate, according to an exemplary embodiment of the inventive concept. A layout of the 2N-bit voltage level shifter 500 may configure one unit cell 500c.

Referring to FIG. 13, the unit cell 500c has a length X13 in an X axis direction and has a length Y13 in a Y axis direction. The length Y13 may be an integer multiple (for example, twice) of the height of the standard cell. The unit cell 500c includes first and fourth wells 510c and 540c biased to a first voltage VDD1 and second and third wells 520c and 530c biased to a second voltage VDD2. For example, the unit cell 500c may be configured by merging the layout of the unit cell of FIG. 11 with a layout which is symmetrical about the unit cell 500b with respect to an axis parallel to a Y axis. For example, as illustrated in FIG. 13, the unit cell 500c may be configured with first and second regions R51c to R52c respectively corresponding to the first and second multi-bit circuits 501 and 502, and the first region R51c may be symmetrical about the second region R52c with respect to the axis parallel to the Y axis.

Figure 14A:
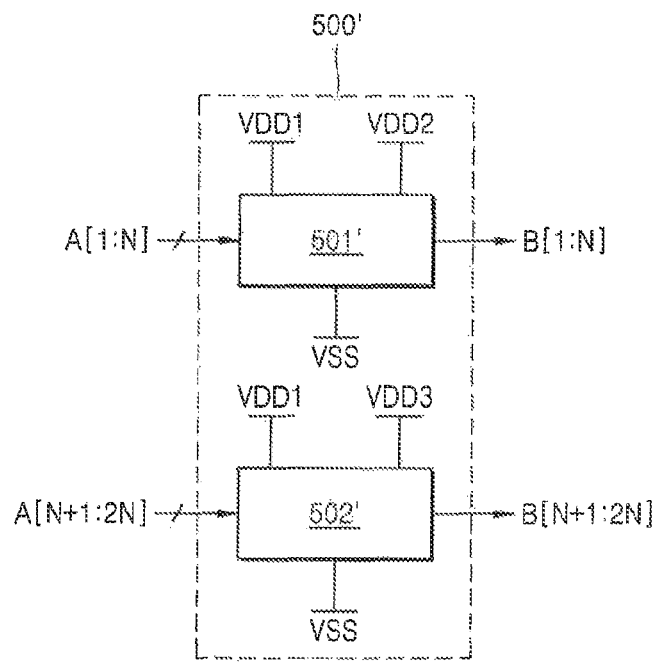
FIG. 14A is a block diagram of a voltage level shifter according to an exemplary embodiment of the inventive concept.
Figure 14B:
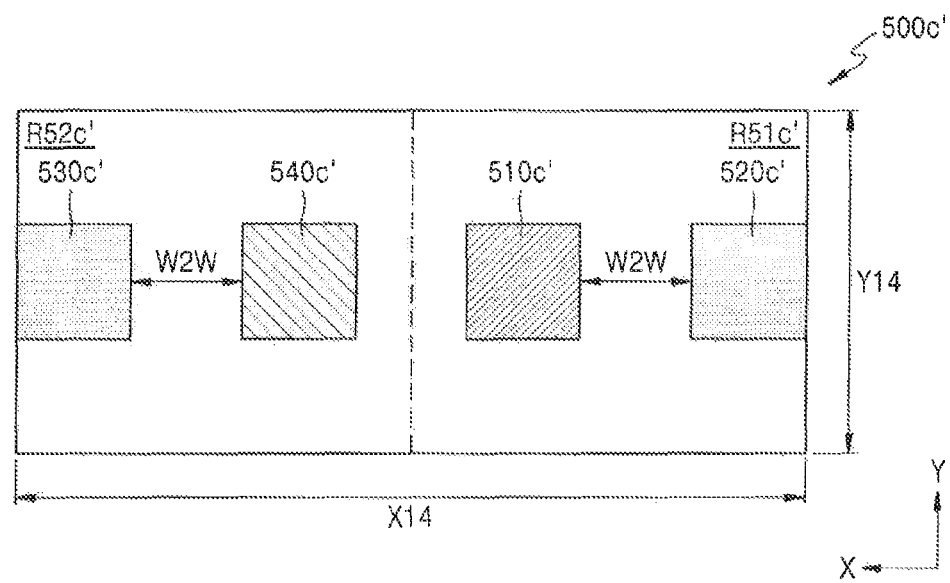
FIG. 14B is a diagram illustrating an example of a layout where the voltage level shifter of FIG. 14A is disposed on a substrate.

FIG. 14A is a block diagram of a voltage level shifter 500' according to an exemplary embodiment of the inventive concept, and FIG. 14B is a diagram illustrating an example of a layout where the voltage level shifter 500' of FIG. 14A is disposed on a substrate. In detail, the voltage level shifter 500' illustrated in FIG. 14A may be referred to as a 2N-bit voltage level shifter for processing 2N number of bit signals, and a layout of the voltage level shifter 500 may configure one unit cell 500c'.

Referring to FIG. 14A, the voltage level shifter 500' includes a first multi-bit circuit 501' and a second multi-bit circuit 502'. The first multi-bit circuit 501' is supplied with a first voltage VDD1 and a second voltage VDD2, and the second multi-bit circuit 502' is supplied with the first voltage VDD1 and a third voltage VDD3. In the first multi-bit circuit 501', the first voltage VDD1 may correspond to a high voltage level defined by a voltage level logic on which N number of first input signals A[1:N] are based, and the second voltage VDD2 may correspond to a high voltage level defined by a voltage logic level on which N number of first output signals B[1:N] are based. Also, in the second multi-bit circuit 502', the first voltage VDD1 may correspond to a high voltage level defined by a voltage level logic on which N number of second input signals A[N+1:2N] are based, and the third voltage VDD3 may correspond to a high voltage level defined by a voltage logic level on which N number of second input signals B[N+1:2N] are based. In the exemplary embodiment of FIGS. 4A and 4B, N may be an integer equal to or more than one, and when N is one, the first multi-bit circuit 501' may be referred to as a first bit circuit, and the second multi-bit circuit 502' may be referred to as a second bit circuit.

As illustrated in FIG. 14A, the voltage level shifter 500' is supplied with three or more supply voltages and may receive a plurality of input signals based on different voltage logic levels logics or may output a plurality of output signals based on different voltage logic levels. For example, in a case where a signal output from one block is transmitted to two or more blocks using different supply voltages, a level shifter that outputs a plurality of output signals based on different voltage logic levels may be used.

Referring to FIG. 14B, the unit cell 500c' has a length X14 in an X axis direction and has a length Y14 in a Y axis direction. The length Y11 may be an integer multiple (for example, twice) of the height of the standard cell. The unit cell 500c' includes first to fourth wells 510c' to 540c'. According to an exemplary embodiment, the first well 510c' and the fourth well 540c' among the first to fourth wells 510c' to 540c' may be biased to different voltages. For example, the second well 520c' and the third well 530c' may be biased to the first voltage VDD1, and the first well 510c' and the fourth well 540c' may be respectively biased to the second voltage VDD2 and the third voltage VDD3. That is, a voltage level shifter that receives a plurality of input signals based on the same voltage logic level to output a plurality of output signals based on different voltage logic levels may be implemented as one unit cell 500c'. Therefore, an area of a layout corresponding to the voltage level shifter is reduced in comparison with an area of a layout using two or more unit cells. For example, in a case of using the unit cell 100a of FIG. 2, a total of five wells may be used in order for a unit cell, including the first well 110a biased to the second voltage VDD2, to be disposed adjacent to a unit cell including the first well 100a biased to the third voltage VDD3, but the unit cell 500c' of FIG. 14B may include only four wells, whereby the length X14 of the unit cell 500c' in the X axis direction may be smaller than two times the length X2.

Figure 15:
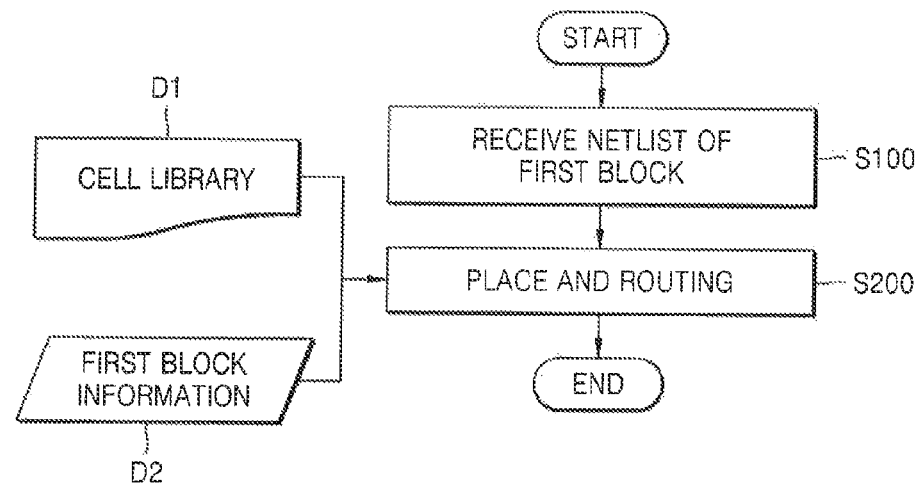
FIG. 15 is a flowchart illustrating a method of generating a layout of an IC, according to an exemplary embodiment of the inventive concept.

FIG. 15 is a flowchart illustrating a method of generating a layout of an IC, according to an exemplary embodiment of the inventive concept. Hereinafter, methods of generating a layout of an IC based on flowcharts of FIGS. 15 to 17 may be performed by a semiconductor design tool. The semiconductor design tool may be software including instructions executed by a processor and/or the like. The semiconductor design tool may perform the methods of generating a layout of an IC according to exemplary embodiments, in a computing system including processors such as a personal computer (PC), a server, and/or the like.

Referring to FIG. 15, in operation S100, an operation of receiving a netlist of a first block is performed. The netlist may be information that defines a configuration of an IC. For example, the information may identify a plurality of electronic devices included in the IC and define connections between the electronic devices. The semiconductor design tool may generate a layout of an IC, based on the netlist of the IC. In the exemplary embodiment of FIG. 15, the netlist includes information that defines a configuration of the first block included in the IC.

The first block defined by the netlist may include at least one voltage level shifter. For example, as illustrated in FIG. 1, the first block may include the voltage level shifter 100 for processing a single bit signal, and as illustrated in FIGS. 3A, 4A and 5A, the first block may include the multi-bit voltage level shifter 200 (400 or 500).

In operation S200, a place and routing operation is performed. For example, the semiconductor design tool may arrange unit cells on a substrate from the netlist defining the first block with reference to a cell library D1 and first block information D2 and may form wires, thereby performing the place and route operation. The cell library D1 may include information (for example, topological data of a unit cell) about a plurality of unit cells and may include information about unit cells corresponding to the voltage level shifters according to exemplary embodiments. The first block information D2 may include information about the first block included in the IC. For example, the first block information D2 may include an area, edge information, a supply voltage, and a power consumption amount of the first block.

The semiconductor design tool may search the cell library D1 to obtain a unit cell corresponding to a voltage level shifter included in the netlist of the first block and may dispose the unit cell on the substrate, based on the first block information D2. According to an exemplary embodiment, the cell library D1 may be disposed on an edge of a block and may include information about a unit cell corresponding to the voltage level shifter. The semiconductor design tool may dispose the unit cell, corresponding to the voltage level shifter included in the netlist of the first block, on the edge of the first block with reference to the cell library D1 and the first block information D2. Therefore, since an area occupied by the voltage level shifter in the layout of the first block is reduced, a layout size of the first block is reduced, or a freedom of degree of design for disposing and routing unit cells for generating the layout of the first block increases.

Figure 16:
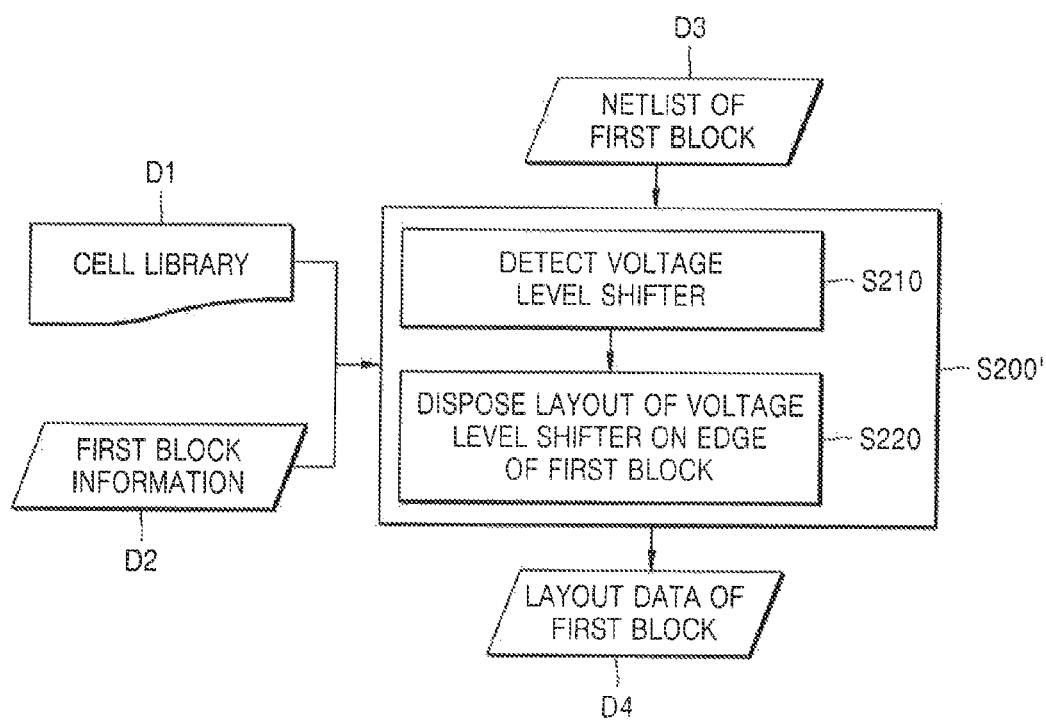
FIG. 16 is a flowchart illustrating an example of operation S200 of FIG. 15 according to an exemplary embodiment of the inventive concept.

FIG. 16 is a flowchart illustrating an example S200' of operation S200 of FIG. 15 according to an exemplary embodiment of the inventive concept. As described above with reference to FIG. 15, the place and routing operation of generating the layout of the first block may be performed in operation S200. As illustrated in FIG. 16, an operation of generating layout data D4 of the first block from a netlist D3 of the first block with reference to the cell library D1 and edge information D2 of the first block may be performed in operation S200', and operation S200' may include operation S210 and operation S220.

An operation of detecting a voltage level shifter from the netlist D3 of the first block is performed in operation S210. As described above, the first block may include at least one voltage level shifter, and the semiconductor design tool may detect a voltage level shifter from the netlist D3 of the first block.

An operation of disposing a layout of the voltage level shifter on an edge of the first block is performed in operation S220. For example, the semiconductor design tool may search the cell library D1 for a unit cell corresponding to the voltage level shifter which is detected in operation S210, and may dispose the found unit cell on the edge of the first block, based on edge information included in the information D2 of the first block. The layout data D4 of the first block may be disposed on the edge of the first block and may include a unit cell corresponding to the voltage level shifter.

Figure 17:
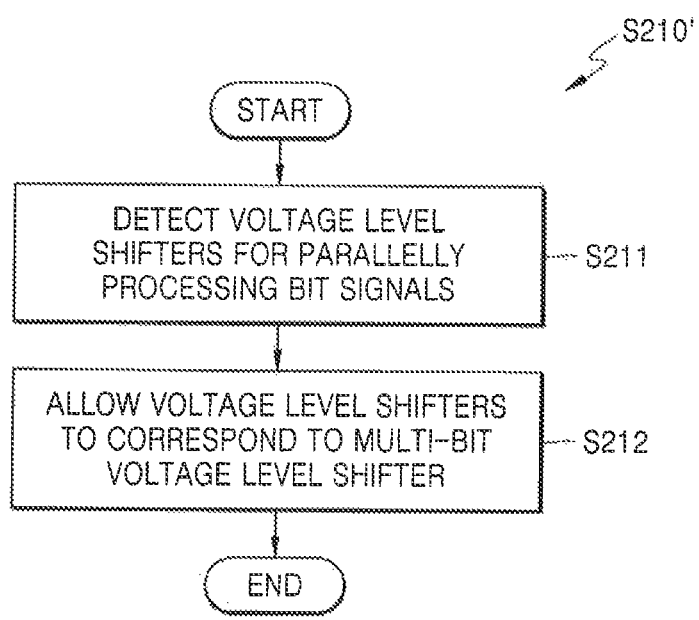
FIG. 17 is a flowchart illustrating an example of operation S210 of FIG. 16 according to an exemplary embodiment of the inventive concept.

FIG. 17 is a flowchart illustrating an example S210' of operation S210 of FIG. 16 according to an exemplary embodiment of the inventive concept. As described above with reference to FIG. 16, an operation of detecting a voltage level shifter from the netlist D3 of the first block may be performed in operation S210. Referring to FIG. 17, operation S210' may include operation S211 and operation S212. In operation S210', a plurality of voltage level shifters may correspond to one unit cell, and thus, an area necessary for disposing the plurality of voltage level shifters on a substrate is reduced.

An operation of detecting a plurality of voltage level shifters that parallelly process a plurality of bit signals is performed in operation S211. As described above, digital data may include a plurality of bit signals, which may be parallelly processed. Therefore, a plurality of voltage level shifters that parallelly process a plurality of bit signals may be detected to be disposed as one unit cell.

An operation of allowing the plurality of voltage level shifters to correspond to a multi-bit voltage level shifter is performed in operation S212. For example, if digital data includes eight bit signals and eight voltage level shifters for parallelly processing eight bit signals are detected, four unit cells 200a and 200b of the voltage level shifter 200 illustrated in FIGS. 3B and 9 may be selected, and two unit cells 400a and 400b of the voltage level shifter 400 illustrated in FIGS. 4B and 10 may be selected, or a voltage level shifter (for example, when N is four in the unit cells 500a and 500b of the voltage level shifter 500 illustrated in FIGS. 5B and 11) corresponding to one unit cell that parallelly processes eight bit signals may be selected.

Figure 18:
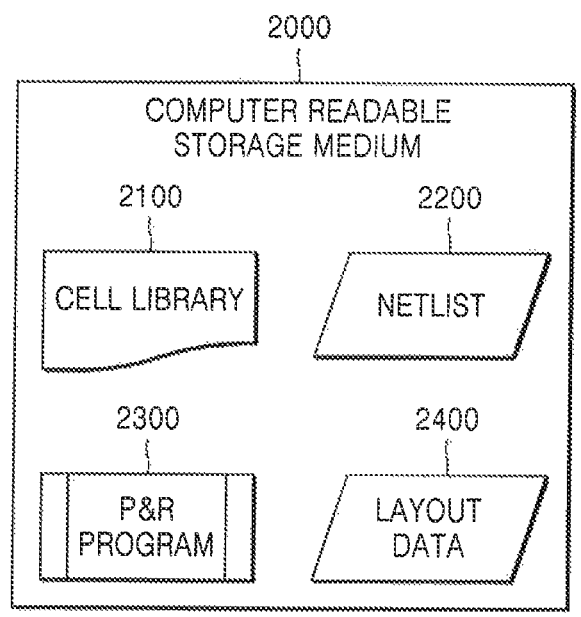
FIG. 18 is a block diagram illustrating a computer-readable storage medium according to an exemplary embodiment of the inventive concept.

FIG. 18 is a block diagram illustrating a computer-readable storage medium 2000 according to an exemplary embodiment of the inventive concept. Referring to FIG. 18, the computer-readable storage medium 2000 includes a cell library 2100, a netlist 2200, a place and routing program 2300, and a layout data 2400. In FIG. 18, the cell library 2100, the netlist 2200, the place and routing program 2300, and the layout data 2400 are illustrated as being stored in one storage medium, but the present embodiment is not limited thereto. In other exemplary embodiments, the cell library 2100, the netlist 2200, the place and routing program 2300, and the layout data 2400 may be respectively stored in different storage mediums.

The computer-readable storage medium 2000 may include an arbitrary storage medium which may be read by a computer while being used to supply instructions and/or data to the computer. For example, examples of the computer-readable storage medium 2000 may include magnetic or optical mediums such as disks, tapes, CD-ROMs, DVD-ROMs, CD-R, CD-RW, DVD-R, and DVD-RW, volatile or nonvolatile memories such as random access memories (RAMs), read-only memories (ROMs), and flash memories, nonvolatile memories which may be accessed through a universal serial bus (USB), and microelectromechanical systems (MEMSs). The computer-readable storage medium 2000 may be inserted into a computer, may be integrated into a computer, or may be coupled to a computer through a communication medium such as a network and/or a wireless link.

The cell library 2100 may include information (for example, topological information about a plurality of unit cells) about a plurality of unit cells which are used to generate the layout data 2400 of an IC from the netlist 2200 of the IC. The cell library 2100 may include information about the unit cells of the voltage level shifter according to exemplary embodiments. For example, the unit cells of the voltage level shifter may each include a well where a transistor is not disposed. Also, each of the unit cells of the voltage level shifter may be an edge cell disposed on an edge of a block and may include two wells biased to two different voltages.

The netlist 2200 may include information that defines a configuration of at least one block in an IC including a plurality of blocks. The layout data 2400 may include information that indicates sizes and positions of features on a substrate like GDSII. An IC or a semiconductor device including the IC may be manufactured in a semiconductor process, based on the layout data 2400.

The place and routing program 2300 may generate the layout data 2400 from the netlist 2200 with reference to the cell library 2100. For example, the place and routing program 2300 may perform all or some of the operations included in the flowcharts of FIGS. 15 to 17. For example, a layout indicated by the layout data 2400 generated by the place and routing program 2300 may include a unit cell of a voltage level shifter disposed on an edge of a block.

Figure 19:
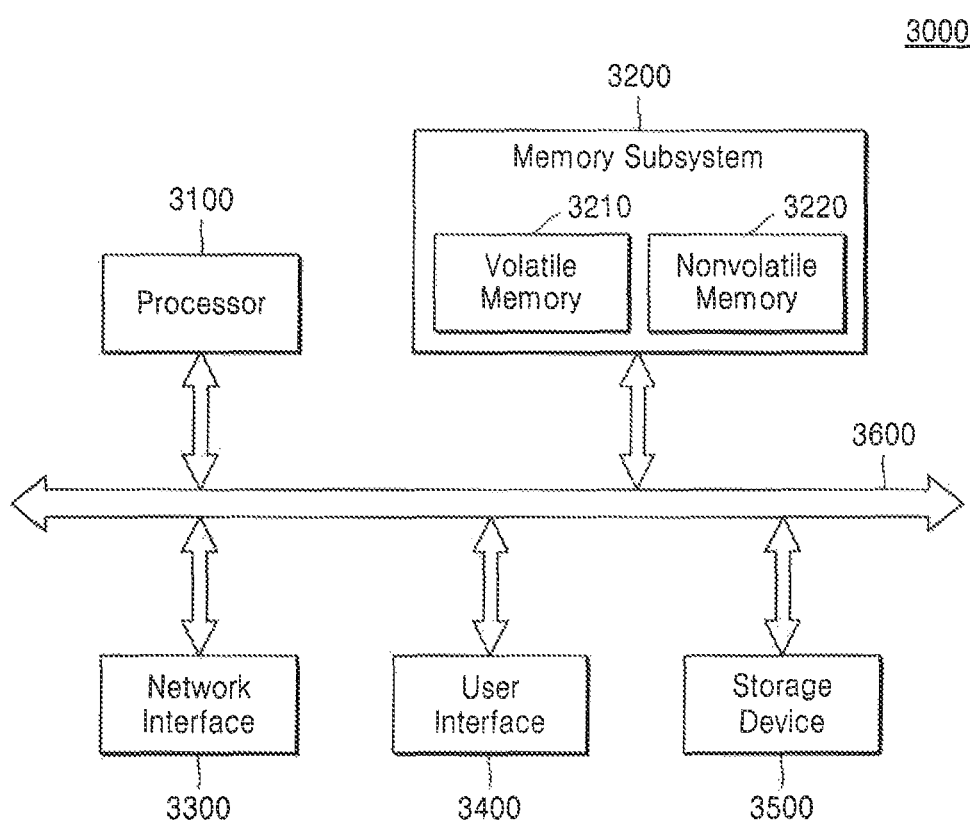
FIG. 19 is a block diagram illustrating a computing system according to an exemplary embodiment of the inventive concept.

FIG. 19 is a block diagram illustrating a computing system 3000 according to an exemplary embodiment of the inventive concept. As illustrated in FIG. 19, the computing system 3000 may include a processor 3100 (e.g., a central processing unit), a memory subsystem 3200, a network interface 3300, a user interface 3400, and a storage device 3500. The elements may communicate with each other through a bus 3600.

The processor 3100 may be configured to execute instructions which perform at least one of the above-described methods according to exemplary embodiments. For example, the processor 3100 may execute a plurality of instructions for an operation of generating layout data from a netlist. That is, all or some of the operations included in the flowcharts according to exemplary embodiments may be performed by the processor 3100. According to an exemplary embodiment, the processor 3100 may execute an arbitrary instruction set (for example, IA-32 (Intel Architecture-32), 64-bit extension IA-32, x86-64, PowerPC, Sparc, MIPS, ARM, IA-64, etc.). Also, the computing system 3000 may include one or more processors.

The memory subsystem 3200 may include a volatile memory 3210 and a nonvolatile memory 3220. The volatile memory 3210 and the nonvolatile memory 3220 may each include an arbitrary type of memory device. For example, examples of the nonvolatile memory 3210 may include dynamic random access memory (DRAM), static random access memory (SRAM), mobile DRAM, double data rate synchronous dynamic random access memory (DDR SDRAM), low power DDR (LPDDR) SDRAM, graphic DDR (GDDR) SDRAM, Rambus dynamic random access memory (RDRAM), etc. Also, examples of the nonvolatile memory 3220 may include electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), etc. Although not shown, the computing system 300 may include a memory controller for an interface of the memory subsystem 3200, and/or the processor 3100 may include the memory controller.

The memory subsystem 3200 may store instructions, which perform at least a portion of the above-described method of generating layout data of an IC, and/or data obtained through processing by the processor 3100. For example, the nonvolatile memory 3220 may store a plurality of instructions for an operation, where the processor 3100 detects a voltage level shifter from a netlist, and an operation of disposing a layout of the voltage level shifter on an edge of a block, and the volatile memory 3210 may store data which is generated while the operations are being performed. Therefore, the processor 3100 may perform the methods according to exemplary embodiments.

The network interface 3300 may provide an interface for an external network. For example, the external network may include a plurality of computing systems and communication links connected to each other. The communication links may include wired links, optical links, wireless links, or other arbitrary type of links.

The user interface 3400 may provide an interface for a user. The user interface 3400 may include an input device such as a keyboard, a pointing device, and/or the like, and may also include an output device such as a display device, a printer, and/or the like. For example, a designer may set the first block information D2 of FIG. 16 through the user interface 3400 and may check a layout, indicated by the layout data D4 of the first block, through a display device.

The storage device 3500 may include a storage medium which is detachably attached to the computing system 3000. For example, the storage device 3500 may include the computer-readable storage medium 2000 illustrated in FIG. 17. When the computing system 3000 operates on data (for example, a netlist of an IC) stored in the storage device 3500, the data may be transferred to the memory subsystem 3200 through the bus 3600. Also, data (for example, layout data) stored in the memory subsystem 3200 may be transferred to the storage device 3500 according to control by the processor 3100, and the storage device 3500 may store received data.

While the inventive concept has been particularly shown and described with reference to exemplary embodiments thereof, it will be understood that various changes in form and details may be made therein without departing from the spirit and scope of the inventive concept.

What is claimed is:

1. An integrated circuit (IC) comprising:
   at least one block including a first cell disposed on an edge of the at least one block, wherein the first cell comprises:
      a first circuit configured to shift a first bit signal between a first voltage logic level and a second voltage logic level;
      a first well biased to a first voltage, wherein the first well is spaced apart from a first edge of the first cell; and
      a second well biased to a second voltage, wherein the second well is disposed to contact a second edge of the first cell opposite to the first edge,
   wherein the first edge of the first cell contacts the edge of the at least one block,
   wherein the first circuit comprises a plurality of transistors respectively disposed in the first and second wells,
   wherein the first cell further comprises a termination gate line formed along the first edge, the termination gate line contacting the first edge, and the termination gate line having a width broader than a width of each of gate lines of the plurality of transistors.

2. The IC of claim 1, wherein a distance between the first well and the first edge is half or more of a distance based on a well-to-well space rule.

3. The IC of claim 1, wherein the at least one block further comprises a second cell disposed adjacent to the first cell with the second edge as a boundary.

4. The IC of claim 1, wherein the first cell further comprises a second circuit configured to shift a second bit signal between the first voltage logic level and the second voltage logic level, and the second circuit comprises a plurality of transistors respectively disposed in the first and second wells.

5. The IC of claim 4, wherein the first cell further comprises:
   a third circuit configured to shift a third bit signal between the first voltage logic level and the second voltage logic level; and
   a fourth circuit configured to shift a fourth bit signal between the first voltage logic level and the second voltage level logic,
   wherein the third and fourth circuits each comprise a plurality of transistors respectively disposed in the first and second wells.

6. The IC of claim 1, wherein the first cell further comprises:
   a first multi-bit circuit configured to shift N number of bit signals between the first voltage logic level and the second voltage logic level, the first multi-bit circuit including the first circuit; and
   a second multi-bit circuit configured to shift N number of bit signals between the first voltage logic level and the second voltage logic level,
   wherein the first and second multi-bit circuits each comprise a plurality of transistors respectively disposed in the first and second wells, and
   wherein N is an integer greater than 2.

7. The IC of claim 1, wherein a length of the first cell in a first direction parallel to the first and second edges is an integer multiple of a length of a standard cell, based on a semiconductor process of manufacturing the IC, in the first direction.

8. The IC of claim 1, wherein an area of the second well is determined based on a well proximity effect which occurs in other cells contacting the second edge.

9. An integrated circuit (IC) comprising:
a first circuit disposed on a substrate and configured to shift a first bit signal between a first voltage logic level and a second voltage logic level;
a second circuit disposed on the substrate and configured to shift a second bit signal between the first voltage logic level and the second voltage logic level;
a first well disposed in a cell on the substrate and biased to a first voltage, wherein the first well is spaced apart from a first edge of the cell; and
second and third wells disposed in the cell and biased to a second voltage different from the first voltage,
wherein the second well contacts the first edge and the third well contacts a second edge of the cell opposite to the first edge,
wherein the first and second circuits each comprise at least one of a plurality of transistors disposed in the first well and at least one of a plurality of transistors disposed in the second well, and
wherein the first, second, and third wells each overlap the first and second circuits.

10. The IC of claim 9, wherein the at least one of a plurality of transistors included in the first or second circuit is not disposed in the third well.

11. The IC of claim 9, wherein the cell further comprises:
a first multi-bit circuit configured to shift N number of bit signals between the first voltage level logic and the second voltage level logic, the first multi-bit circuit including the first circuit; and
a second multi-bit circuit configured to shift N number of bit signals between the first voltage logic level and the second voltage logic level, the second multi-bit circuit including the second circuit,
wherein the first and second multi-bit circuits each comprise a plurality of transistors respectively disposed in the first and second wells, and
wherein N is an integer greater than 1.

12. The IC of claim 9, wherein the cell farther comprises:
a third circuit configured to shift a third bit signal between the second voltage logic level and a third voltage logic level;
a fourth circuit configured to shift a fourth bit signal between the second voltage logic level and the third voltage logic level; and
a fourth well disposed in the cell and biased to a third voltage different from the second voltage,
wherein the fourth well is spaced apart from the first edge between the first well and the third well, and
wherein the third and fourth circuits each comprise a plurality of transistors disposed in the third and fourth wells.

13. The IC of claim 12, wherein the first voltage logic level differs from the third voltage logic level, and the first voltage differs from the third voltage.

14. The IC of claim 12, wherein the cell further comprises:

a first multi-bit circuit configured to shift N number of bit signals between the first voltage logic level and the second voltage level logic, the first multi-bit circuit including the first and second circuits; and
a second multi-bit circuit configured to shift N number of bit signals between the second voltage logic level and the third voltage level logic, the second multi-bit circuit including the third and fourth circuits,
wherein the first multi-bit circuit comprises a plurality of transistors respectively disposed in the first and second wells,
wherein the second multi-bit circuit comprises a plurality of transistors respectively disposed in the third and fourth wells, and
wherein N is an integer greater than 2.

15. An integrated circuit (IC) comprising a first cell, wherein the first cell comprises:
a voltage level shifter disposed on a substrate and configured to shift a first signal between a first logic level and a second logic level;
a first doped region biased to a first voltage;
a second doped region biased to a second voltage,
wherein a first edge of the first doped region is spaced apart from a first edge of the first cell by a first distance,
wherein a second opposing edge of the first doped region is spaced apart from a second opposing edge of the first cell by a second distance,
wherein the first distance is less than the second distance,
wherein an edge of the second doped region contacts the second edge of the first cell, and
wherein the voltage level shifter comprises a first transistor disposed in the first doped region and a second transistor disposed in the second doped region.

16. The IC of claim 15, further comprises a second cell disposed adjacent to the first cell, a first edge of the second cell contacting the first edge of the first cell, and
wherein the second cell comprises a third doped region and a fourth doped region which are biased to different voltages respectively,
wherein the fourth doped region is spaced apart from a boundary of the second cell,
wherein an edge of the third doped region contacts a second opposing edge of the second cell, and
wherein the third doped region is biased to the second voltage.

17. The IC of claim 16, wherein a distance between the first doped region and the fourth doped region is equal or more of a distance based on a well-to-well space rule.

18. The IC of claim 16, wherein the second cell further comprises a voltage level shifter, and
wherein the voltage level shifter of the second cell comprises a third transistor disposed in the third doped region and a four transistor disposed in the fourth doped region.

19. The IC of claim 18, wherein the first cell and the second cell are disposed symmetrically with respect to the first edge of the first cell.

* * * * *